(12) United States Patent
Begley et al.

(10) Patent No.: US 8,956,738 B2
(45) Date of Patent: *Feb. 17, 2015

(54) ORGANIC ELEMENT FOR LOW VOLTAGE ELECTROLUMINESCENT DEVICES

(75) Inventors: William J. Begley, Webster, NY (US); Tukaram K. Hatwar, Penfield, NY (US); Liang-Sheng Liao, Suzhou (CN); Kevin P. Klubek, West Henrietta, NY (US); Manju Rajeswaran, Fairport, NY (US); Natasha Andrievsky, Webster, NY (US)

(73) Assignee: Global OLED Technology LLC, Herndon, VA (US)

( * ) Notice: Subject to any disclaimer, the term of this patent is extended or adjusted under 35 U.S.C. 154(b) by 794 days.

This patent is subject to a terminal disclaimer.

(21) Appl. No.: 12/573,175

(22) Filed: Oct. 5, 2009
(Under 37 CFR 1.47)

(65) Prior Publication Data

US 2010/0019671 A1    Jan. 28, 2010

Related U.S. Application Data

(63) Continuation-in-part of application No. 11/796,953, filed on Apr. 30, 2007, which is a continuation of application No. 11/501,336, filed on Aug. 9, 2006, which is a continuation-in-part of application No. 11/259,290, filed on Oct. 26, 2005, now abandoned.

(51) Int. Cl.
*H01J 1/63* (2006.01)
*H01L 51/00* (2006.01)
*H01L 51/50* (2006.01)

(52) U.S. Cl.
CPC ........ *H01L 51/0058* (2013.01); *H01L 51/0077* (2013.01); *H01L 51/0052* (2013.01);
(Continued)

(58) Field of Classification Search
None
See application file for complete search history.

(56) References Cited

U.S. PATENT DOCUMENTS

| 3,172,862 A | 3/1965 | Gurnee et al. |
| 3,173,050 A | 3/1965 | Gurnee |

(Continued)

FOREIGN PATENT DOCUMENTS

| EP | 0 732 868 | 9/1996 |
| EP | 0 891 121 | 1/1999 |

(Continued)

OTHER PUBLICATIONS

Machine English translation of JP 2003162079 A. Translated Dec. 17, 2009.*

(Continued)

*Primary Examiner* — J. L. Yang
(74) *Attorney, Agent, or Firm* — Global OLED Technology LLC

(57) ABSTRACT

An OLED device including a cathode, a light emitting layer and an anode, in that order, and, having located between the cathode and the light emitting layer, a further layer containing an alkali metal or alkaline earth metal salt of a 2-(2-hydroxyphenyl)phenanthroline derivative, according to Formula (MC) below. Such devices exhibit reduced drive voltage while maintaining good luminance.

Formula (MC)

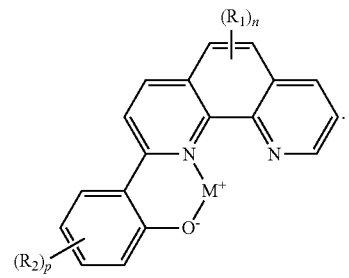

11 Claims, 2 Drawing Sheets

(52) U.S. Cl.
CPC ......... *H01L51/0056* (2013.01); *H01L 51/0059* (2013.01); *H01L 51/0071* (2013.01); *H01L 51/0072* (2013.01); *H01L 51/008* (2013.01); *H01L 51/0081* (2013.01); *H01L 51/5048* (2013.01); *H01L 2251/308* (2013.01); *Y10S 428/917* (2013.01)
USPC ........ 428/690; 428/917; 428/411.1; 428/336; 548/103

(56) References Cited

U.S. PATENT DOCUMENTS

| | | | |
|---|---|---|---|
| 3,180,730 A | 4/1965 | Klupfel et al. | |
| 3,567,450 A | 3/1971 | Brantly et al. | |
| 3,658,520 A | 4/1972 | Brantly et al. | |
| 3,710,167 A | 1/1973 | Dresner | |
| 4,356,429 A | 10/1982 | Tang | |
| 4,539,507 A | 9/1985 | Vanslyke et al. | |
| 4,720,432 A | 1/1988 | Vanslyke et al. | |
| 4,768,292 A | 9/1988 | Manzei et al. | |
| 4,769,292 A | 9/1988 | Tang et al. | |
| 4,885,211 A | 12/1989 | Tang et al. | |
| 4,885,221 A | 12/1989 | Tsuneeda | |
| 5,059,861 A | 10/1991 | Littman et al. | |
| 5,059,862 A | 10/1991 | Vanslyke et al. | |
| 5,061,569 A | 10/1991 | Van Slyke et al. | |
| 5,121,029 A | 6/1992 | Hosokawa et al. | |
| 5,141,671 A | 8/1992 | Bryan et al. | |
| 5,150,006 A | 9/1992 | Van Slyke et al. | |
| 5,151,629 A | 9/1992 | Van Slyke et al. | |
| 5,247,190 A | 9/1993 | Friend et al. | |
| 5,276,380 A | 1/1994 | Tang | |
| 5,283,182 A | 2/1994 | Powell et al. | |
| 5,294,870 A | 3/1994 | Tang et al. | |
| 5,405,709 A | 4/1995 | Littman et al. | |
| 5,409,783 A | 4/1995 | Tang et al. | |
| 5,484,922 A | 1/1996 | Moore et al. | |
| 5,503,910 A | 4/1996 | Matsuura et al. | |
| 5,516,577 A | 5/1996 | Matsuura et al. | |
| 5,552,678 A | 9/1996 | Tang et al. | |
| 5,554,450 A | 9/1996 | Shi et al. | |
| 5,593,788 A | 1/1997 | Shi et al. | |
| 5,608,287 A | 3/1997 | Hung et al. | |
| 5,645,948 A | 7/1997 | Shi et al. | |
| 5,677,572 A | 10/1997 | Hung et al. | |
| 5,683,823 A | 11/1997 | Shi et al. | |
| 5,703,436 A | 12/1997 | Forrest et al. | |
| 5,714,838 A | 2/1998 | Haight et al. | |
| 5,739,545 A | 4/1998 | Guha et al. | |
| 5,755,999 A | 5/1998 | Shi et al. | |
| 5,776,622 A | 7/1998 | Hung et al. | |
| 5,776,623 A | 7/1998 | Hung et al. | |
| 5,837,391 A | 11/1998 | Utsugi | |
| 5,851,709 A | 12/1998 | Grande et al. | |
| 5,908,581 A | 6/1999 | Chen et al. | |
| 5,908,802 A | 6/1999 | Voigt et al. | |
| 5,935,720 A | 8/1999 | Chen et al. | |
| 5,935,721 A | 8/1999 | Shi et al. | |
| 5,969,474 A | 10/1999 | Arai | |
| 5,981,306 A | 11/1999 | Burrows et al. | |
| 6,020,078 A | 2/2000 | Chen et al. | |
| 6,066,357 A | 5/2000 | Tang et al. | |
| 6,097,147 A | 8/2000 | Baldo et al. | |
| 6,137,223 A | 10/2000 | Hung et al. | |
| 6,140,763 A | 10/2000 | Hung et al. | |
| 6,172,459 B1 | 1/2001 | Hung et al. | |
| 6,208,075 B1 | 3/2001 | Hung et al. | |
| 6,208,077 B1 | 3/2001 | Hung | |
| 6,226,890 B1 | 5/2001 | Boroson et al. | |
| 6,237,529 B1 | 5/2001 | Spahn et al. | |
| 6,278,236 B1 | 8/2001 | Madathil et al. | |
| 6,337,492 B1 | 1/2002 | Jones et al. | |
| 6,396,209 B1 | 5/2002 | Kido et al. | |
| 6,413,656 B1 | 7/2002 | Thompson et al. | |
| 6,451,415 B1 | 9/2002 | Forrest et al. | |
| 6,451,455 B1 | 9/2002 | Thompson et al. | |
| 6,458,475 B1 | 10/2002 | Adachi et al. | |
| 6,468,676 B1 | 10/2002 | Ueda et al. | |
| 6,509,109 B1 | 1/2003 | Nakamura | |
| 6,515,298 B2 | 2/2003 | Forrest et al. | |
| 6,558,817 B1 | 5/2003 | Ueda et al. | |
| 6,573,651 B2 | 6/2003 | Adachi et al. | |
| 6,603,140 B2 * | 8/2003 | Kobori et al. | 257/40 |
| 6,624,571 B1 | 9/2003 | Toyoyasu et al. | |
| 6,653,654 B1 | 11/2003 | Che | |
| 6,703,180 B1 | 3/2004 | Boroson et al. | |
| 6,720,573 B2 | 4/2004 | Son et al. | |
| 7,198,859 B2 * | 4/2007 | Kwong et al. | 428/690 |
| 2002/0025419 A1 | 2/2002 | Lee et al. | |
| 2002/0086180 A1 | 7/2002 | Seo et al. | |
| 2002/0100906 A1 | 8/2002 | Takiguchi et al. | |
| 2002/0117662 A1 | 8/2002 | Nii | |
| 2002/0121638 A1 | 9/2002 | Grushin et al. | |
| 2002/0197511 A1 | 12/2002 | D Andrade et al. | |
| 2003/0017361 A1 | 1/2003 | Thompson et al. | |
| 2003/0040627 A1 | 2/2003 | Fujii | |
| 2003/0044643 A1 | 3/2003 | Arakane et al. | |
| 2003/0054198 A1 | 3/2003 | Tsuboyama et al. | |
| 2003/0059646 A1 | 3/2003 | Kamatani et al. | |
| 2003/0068526 A1 | 4/2003 | Kamatani et al. | |
| 2003/0068528 A1 | 4/2003 | Thompson et al. | |
| 2003/0068535 A1 | 4/2003 | Takiguchi et al. | |
| 2003/0072964 A1 | 4/2003 | Kwong et al. | |
| 2003/0124381 A1 | 7/2003 | Thompson et al. | |
| 2003/0141809 A1 | 7/2003 | Furugori et al. | |
| 2003/0175553 A1 | 9/2003 | Thompson et al. | |
| 2004/0070335 A1 | 4/2004 | Cok | |
| 2004/0113547 A1 | 6/2004 | Son et al. | |
| 2004/0161633 A1 | 8/2004 | Seo et al. | |
| 2004/0207318 A1 | 10/2004 | Lee et al. | |
| 2004/0247937 A1 | 12/2004 | Chen et al. | |
| 2004/0255857 A1 | 12/2004 | Chow et al. | |
| 2005/0019605 A1 | 1/2005 | Kwong et al. | |
| 2005/0084713 A1 | 4/2005 | Kido et al. | |
| 2005/0095450 A1 | 5/2005 | Begley et al. | |
| 2005/0095451 A1 * | 5/2005 | Begley et al. | 428/690 |
| 2005/0098207 A1 | 5/2005 | Matsumoto et al. | |
| 2005/0106412 A1 | 5/2005 | Kathirgamanathan | |
| 2005/0123794 A1 | 6/2005 | Deaton et al. | |
| 2005/0164033 A1 | 7/2005 | Chin et al. | |
| 2005/0175859 A1 | 8/2005 | Lin | |
| 2005/0181232 A1 | 8/2005 | Ricks et al. | |
| 2005/0260442 A1 | 11/2005 | Yu et al. | |
| 2006/0181202 A1 * | 8/2006 | Liao et al. | 313/504 |
| 2006/0220004 A1 | 10/2006 | Stossel et al. | |
| 2006/0286402 A1 | 12/2006 | Begley et al. | |
| 2009/0142618 A1 * | 6/2009 | Begley et al. | 428/690 |

FOREIGN PATENT DOCUMENTS

| | | | | |
|---|---|---|---|---|
| EP | 1 029 909 | | 8/2000 | |
| EP | 1 076 368 | | 2/2001 | |
| EP | 1 182 244 | | 2/2002 | |
| EP | 1 187 235 | | 3/2002 | |
| EP | 1 238 981 | | 9/2002 | |
| EP | 1 239 526 | | 9/2002 | |
| EP | 1 244 155 | | 9/2002 | |
| JP | 8-333569 | | 12/1996 | |
| JP | 2003-059667 | | 2/2003 | |
| JP | 2003-073387 | | 3/2003 | |
| JP | 2003-073388 | | 3/2003 | |
| JP | 2003-073665 | | 3/2003 | |
| JP | 2003-162079 | | 6/2003 | |
| JP | 2003162079 A * | | 6/2003 | ............... G03G 5/14 |
| WO | 0032717 | | 6/2000 | |
| WO | WO 00/57676 | | 9/2000 | |
| WO | WO 00/70655 | | 11/2000 | |
| WO | WO 01/39234 | | 5/2001 | |
| WO | WO 01/41512 | | 6/2001 | |
| WO | WO 01/93642 | | 12/2001 | |
| WO | WO 02/15645 | | 2/2002 | |
| WO | WO 02/071813 | | 9/2002 | |
| WO | WO 02/074015 | | 9/2002 | |

(56) References Cited

FOREIGN PATENT DOCUMENTS

| WO | WO 03/046107 | 6/2003 |
|---|---|---|
| WO | 2004/801017 | 9/2004 |
| WO | WO 2006/138075 | 12/2006 |

OTHER PUBLICATIONS

Double Injection Electroluinescence in Anthracene, RCA Review, 30, 322. 1969 by Dresner.
Hung et al., "Recent Progress of molecular organic electroluminescent materials and devices", Materials Science and Engineering, A Review Journal R 39, pp. 143-222, 2002.
Kido et al., "Bright red light-emitting organic electroluminescent devices having a europium complex as an emitter", Appl. Phys. Lett., 65, pp. 2124-2126, 1994.
Ali et al., "Palladium-Catalysed Cross-Coupling Reactions of Arylboronic Acids with π-Deficient Heteroaryl Chlorides[+1]", Tetrahedron vol. 48, No. 37, pp. 8117-8126, 1992.
Halcrow et al., "Attempts to find New Antimalarials. Part XXIV. Derivatives of o-Phenanthroline (7:8:3':2'-pyridoquinoline)", Journal of the Chemical Society, pp. 155-157, 1946.
Hammett, "The Effect of Structure upon the Reactions of Organic Compounds. Benzene Derivatives", Journal of the American Chemical Society, 1937, 59(1), p. 99-103.
Zhryuan et al., "Organic Multi-Layer White LEDs", Chinese Journal of Semiconductors, vol. 21, part 2, 2000, pp. 184-187.

* cited by examiner

ORGANIC ELEMENT FOR LOW VOLTAGE ELECTROLUMINESCENT DEVICES

CROSS-REFERENCE TO RELATED APPLICATIONS

This application is a continuation-in-part of U.S. application Ser. No. 11/796,953, filed Apr. 30, 2007 which was a continuation of U.S. application Ser. No. 11/501,336, filed Aug. 9, 2006 which was a continuation-in-part of U.S. application Ser. No. 11/259,290, filed Oct. 26, 2005, now abandoned, each of which are hereby incorporated by reference in their entirety.

FIELD OF THE INVENTION

This invention relates to an organic light-emitting diode (OLED) electroluminescent (EL) device having a light-emitting layer and a layer between the light-emitting layer and the cathode containing a cyclometallated 2-(2-hydroxyphenyl) phenanthroline.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, 30, 322, (1969); and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often greater than 100V.

More recent organic EL devices include an organic EL element consisting of extremely thin layers (e.g. <1.0 μm) between the anode and the cathode. Herein, the term "organic EL element" encompasses the layers between the anode and cathode. Reducing the thickness lowered the resistance of the organic layers and has enabled devices that operate at much lower voltage. In a basic two-layer EL device structure, described first in U.S. Pat. No. 4,356,429, one organic layer of the EL element adjacent to the anode is specifically chosen to transport holes, and therefore is referred to as the hole-transporting layer, and the other organic layer is specifically chosen to transport electrons and is referred to as the electron-transporting layer. Recombination of the injected holes and electrons within the organic EL element results in efficient electroluminescence.

Since these early inventions, further improvements in device materials have resulted in improved performance in attributes such as color, stability, luminance efficiency and manufacturability, e.g., as disclosed in U.S. Pat. Nos. 5,061,569, 5,409,783, 5,554,450, 5,593,788, 5,683,823, 5,908,581, 5,928,802, 6,020,078, and 6,208,077, amongst others.

U.S. Pat. No. 6,653,654 discloses OLEDs with group 10 metal complexes of bis-2,9-(2-hydroxyphenyl)phenanthrolines as emissive dopants.

U.S. Pat. No. 6,468,676 teaches the use of organic alkali metal complexes, including phenanthroline complexes, for an electron-injection layer located between the light emitting layer and the cathode.

U.S. Pat. No. 6,396,209 describes an OLED structure including a mixed layer of an electron-transporting organic compound and an organic metal complex compound containing at least one of alkali metal ion, alkali earth metal ion, or rare earth metal ion with a 2-(hydroxyphenyl)pyridine. Likewise, U.S. Pat. No. 6,703,180 and U.S. Pat. No. 7,198,859 also teach metal complexes of 2-(hydroxyphenyl)pyridines in a layer adjacent to an emitting layer on the cathode side. WO2004/081017 discloses OLEDs with aluminum complexes of 2-(hydroxyphenyl)pyridines in an electron transport layer.

US Patent Publication 2004/0207318 discloses OLED devices with an organic metal complex in an electron transport layer and a mixture of an electron transport material and an organic metal salt, including LiQ, in an electron injection layer.

Organometallic complexes, such as lithium quinolate (also known as lithium 8-hydroxyquinolate, lithium 8-quinolate, 8-quinolinolatolithium, or Liq) have been used in EL devices, for example see WO 0032717 and US Patent Publication 2005/0106412.

However, these devices do not have all desired EL characteristics in terms of high luminance in combination with low drive voltages. Thus, notwithstanding these developments, there remains a need to reduce drive voltage of OLED devices while maintaining good luminance.

SUMMARY OF THE INVENTION

One embodiment of the invention provides an OLED device comprising a cathode, a light emitting layer and an anode, in that order, and, having located between the cathode and the light emitting layer, a further layer containing an alkali metal or alkaline earth metal salt of a 2-(2-hydroxyphenyl)phenanthroline derivative. In another embodiment, the further layer additionally contains more than 10% by volume of a fused ring aromatic compound chosen from anthracenes or tetracenes.

In yet other embodiments, the further layer is directly adjacent to the light-emitting layer and an additional layer, located between the further layer and the cathode, containing a cyclometalled complex of an organic alkali or alkaline earth metal complex, is present. Alternatively, the further layer is located directly adjacent to the cathode and an additional layer, located between the further layer and the light-emitting layer, is present.

Such devices exhibit reduced drive voltage while maintaining good luminance.

DETAILED DESCRIPTION OF THE INVENTION

Figure 1:
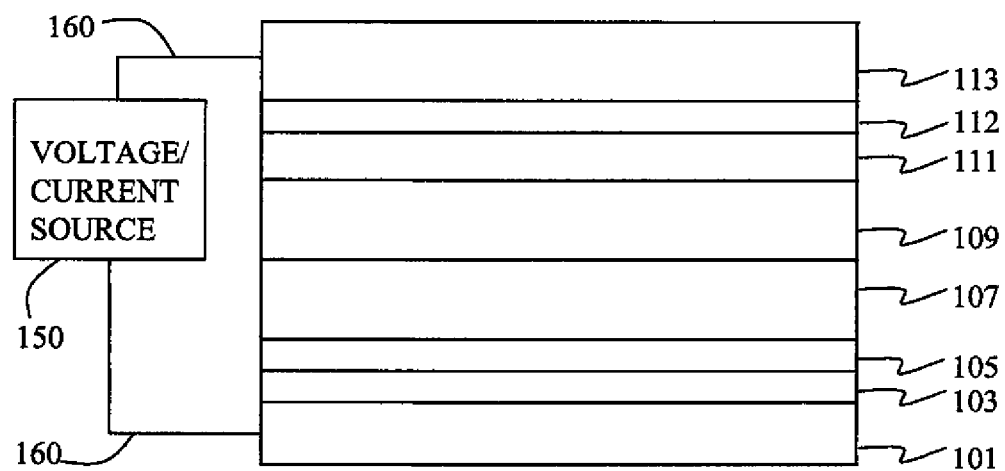
FIG. 1 shows a cross-sectional schematic view of one embodiment of the device of the present invention.

The OLED devices in all aspects of this invention include a cathode, a light emitting layer and an anode in that order. As used herein, two layers are "adjacent" if one layer is juxtaposed with and shares a common boundary with the other layer.

For the purposes of this invention, the terms complex, organic complex and cyclometallated complex describe the complexation of an alkali or alkaline earth metal with an organic molecule via coordinate or dative bonding. The molecule, acting as a ligand, can be mono-, di-, tri- or multidentate in nature, indicating the number of potential coordinating atoms in the ligand. It should be understood that the number of ligands surrounding a metal ion should be sufficient to render the complex electrically neutral. In addition, it should be understood that a complex can exist in different crystalline forms in which there can be more than one metal ion present from form to form, with sufficient ligands present to impart electrical neutrality.

The definition of a coordinate or dative bond can be found in *Grant & Hackh's Chemical Dictionary*, page 91. In essence, a coordinate or dative bond is formed when electron rich atoms such as O or N, donate a pair of electrons to electron deficient atoms such as Al or B. One such example is found in tris(8-quinolinolato)aluminum(III), also referred to as Alq, wherein the nitrogen on the quinoline moiety donates its lone pair of electrons to the aluminum atom thus forming a heterocyclic or cyclometallated ring, called a complex and hence providing Alq with a total of 3 fused rings. The same applies to Liq.

As used herein and throughout this application, the term carbocyclic and heterocyclic rings or groups are generally as defined by the *Grant & Hackh's Chemical Dictionary*, Fifth Edition, McGraw-Hill Book Company. A carbocyclic ring is any aromatic or non-aromatic ring system containing only carbon atoms and a heterocyclic ring is any aromatic or non-aromatic ring system containing both carbon and non-carbon atoms such as nitrogen (N), oxygen (O), sulfur (S), phosphorous (P), silicon (Si), gallium (Ga), boron (B), beryllium (Be), indium (In), aluminum (Al), and other elements found in the periodic table useful in forming ring systems. Also, for the purpose of the aspects of this invention, also included in the definition of a heterocyclic ring are those rings that include coordinate or dative bonds.

In the first embodiment of the invention, the further layer contains an alkali metal or alkaline earth metal salt of a 2-(2-hydroxyphenyl)phenanthroline derivative. Both the 2-(2-hydroxyphenyl) substituent and the phenanthroline nucleus may be further substituted including fused rings. The alkali or alkaline earth metal is a cation that forms a coordinative bond to the anionic hydroxyl group and a dative bond to one or both of the nitrogens of the phenanthroline. Preferably, the metal is an alkali metal with the most preferred being lithium.

Desirably, the 2-(2-hydroxyphenyl)phenanthroline derivative is according to Formula (MC):

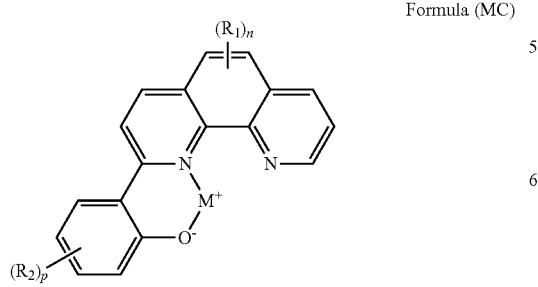

Formula (MC)

wherein M is an alkali metal or alkaline earth metal; $R_1$ and $R_2$ are substituents; and n is 0-7 and p is 0-4. In Formula (MC), M forms a coordinative bond to anionic hydroxyl group and a dative bond to one or both of the nitrogens of the phenanthroline.

The substituents $R_1$ and $R_2$ may be any substituent, preferably alkyl or aryl. Aryl may include aromatic carbocyclic compounds such as phenyl, biphenyl and naphthyl and aromatic heterocyclic compounds such as pryidinyl, thiophenyl and benzimidiazolyl. Any two adjacent $R_1$ substituents or any two adjacent $R_2$ substituents may be joined together to form a fused ring system. Preferably, n is 0 or 1 while p is either 0 or 1. The most preferred is when both n and p are 0.

Some illustrative examples of 2-(2-hydroxyphenyl)phenanthroline derivatives of the invention are:

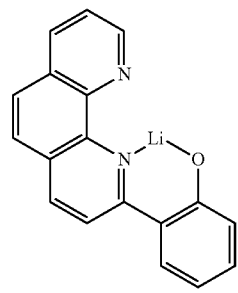

MC-20

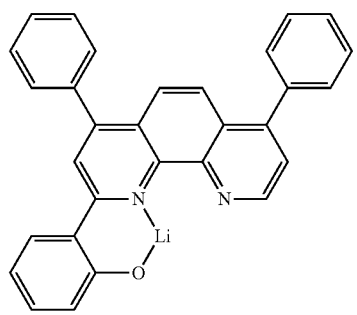

MC-31

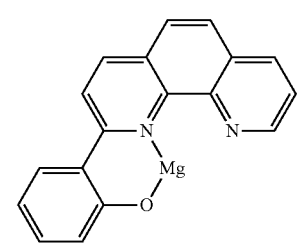

MC-32

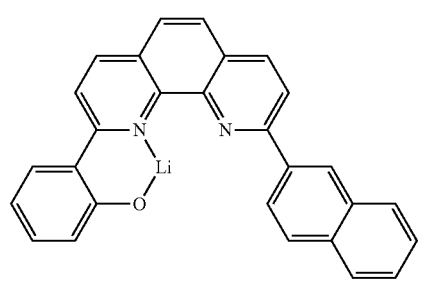

MC-33

MC-34
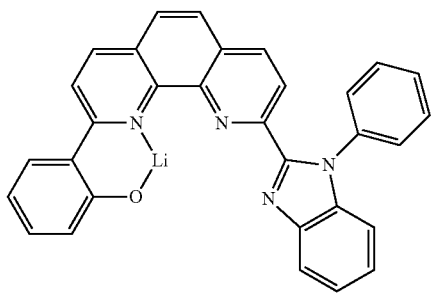

MC-35
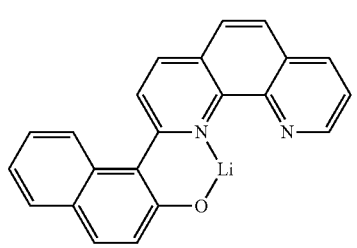

MC-36
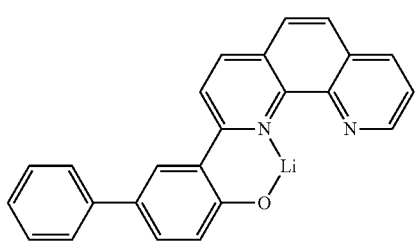

MC-37
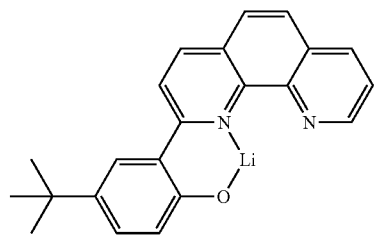

MC-38
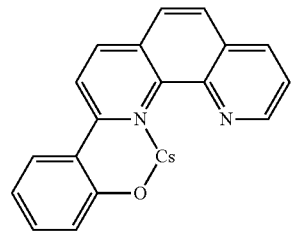

MC-39
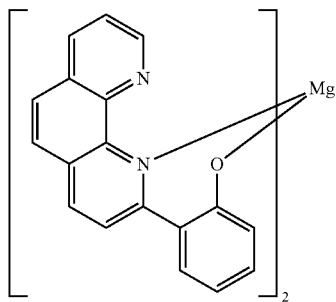

MC-40
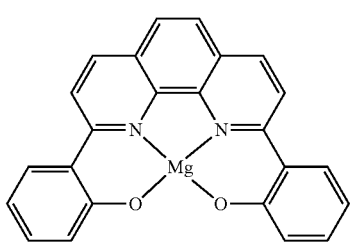

MC-41
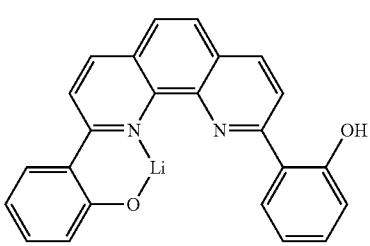

In a second embodiment of the invention, the further layer includes more than 10-volume % of a carbocyclic fused ring aromatic compound chosen from tetracene or anthracene in addition to the organic complex of Formula (MC). Preferably, the carbocyclic fused ring aromatic compound comprises 10%, 20%, 40%, or even 50% or more of the further layer. In such cases, the organic complex of Formula (MC) comprises less than 90%, 80%, 60% or even below 50% or less of the layer. However, it is most desirable that the organic complex of Formula (MC) comprises between 10 and 90% and commonly between 25 and 80% of the inventive layer by volume.

Suitably, the carbocyclic fused ring aromatic compound may be a tetracene represented by Formula (1).

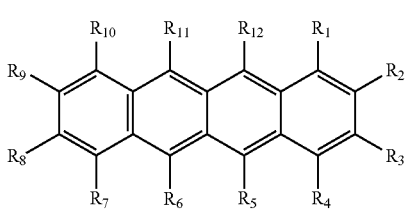

(1)

In Formula (1), $R_1$, $R_2$, $R_3$, $R_4$, $R_5$, $R_6$, $R_7$, $R_8$, $R_9$, $R_{10}$, $R_{11}$, and $R_{12}$ are independently selected as hydrogen or substituent groups, provided that any of the indicated substituents may join to form further fused rings. In one desirable embodiment, $R_1$, $R_4$, $R_7$, and $R_{10}$ represent hydrogen and $R_5$, $R_6$, $R_{11}$, and $R_{12}$ represent independently selected aromatic ring groups.

In a further embodiment, the tetracene may be further represented by Formula (2).

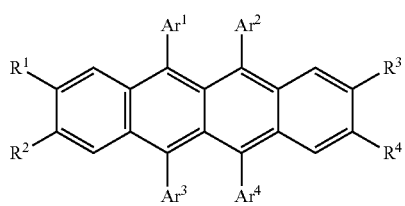

(2)

In Formula (2), $Ar^1$-$Ar^4$ represent independently selected aromatic groups, for example, phenyl groups, tolyl groups, naphthyl groups, 4-biphenyl groups, or 4-t-butylphenyl groups. In one suitable embodiment, $Ar^1$ and $Ar^4$ represent the same group, and independently of $Ar^1$ and $Ar^4$, $Ar^2$ and $Ar^3$ are the same. $R^1$-$R^4$ independently represent hydrogen or a substituent, such as a methyl group, a t-butyl group, or a fluoro group. In one embodiment $R^1$ and $R^4$ are not hydrogen and represent the same group.

Some illustrative examples of useful tetracenes are as follows:

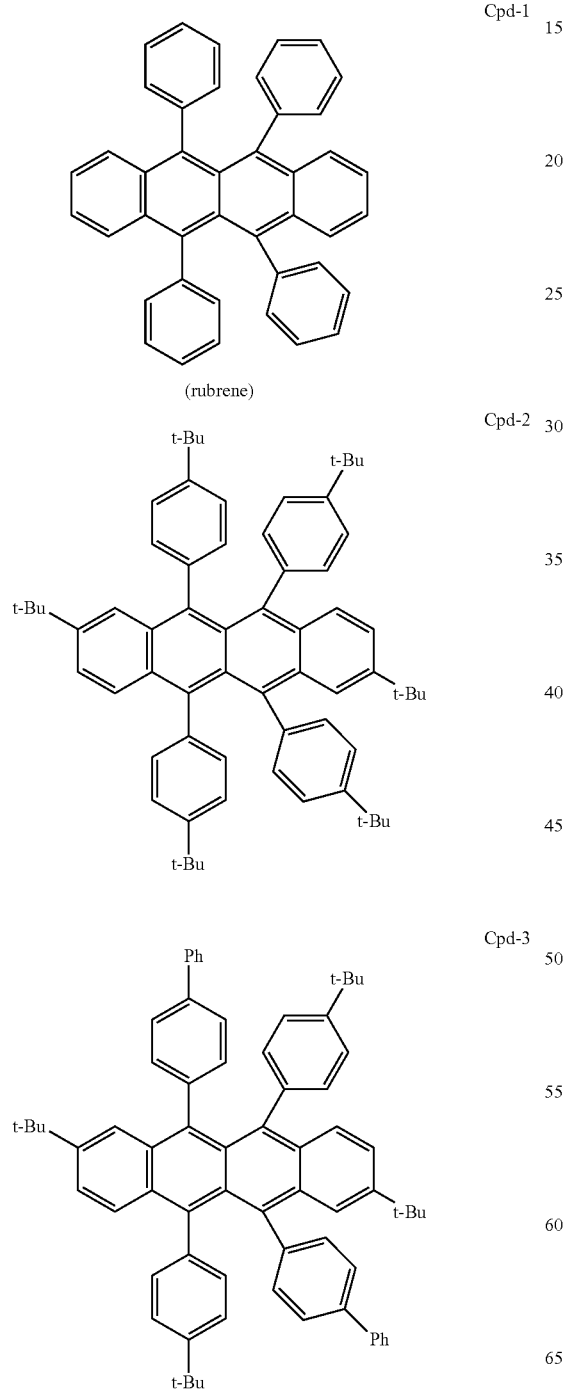

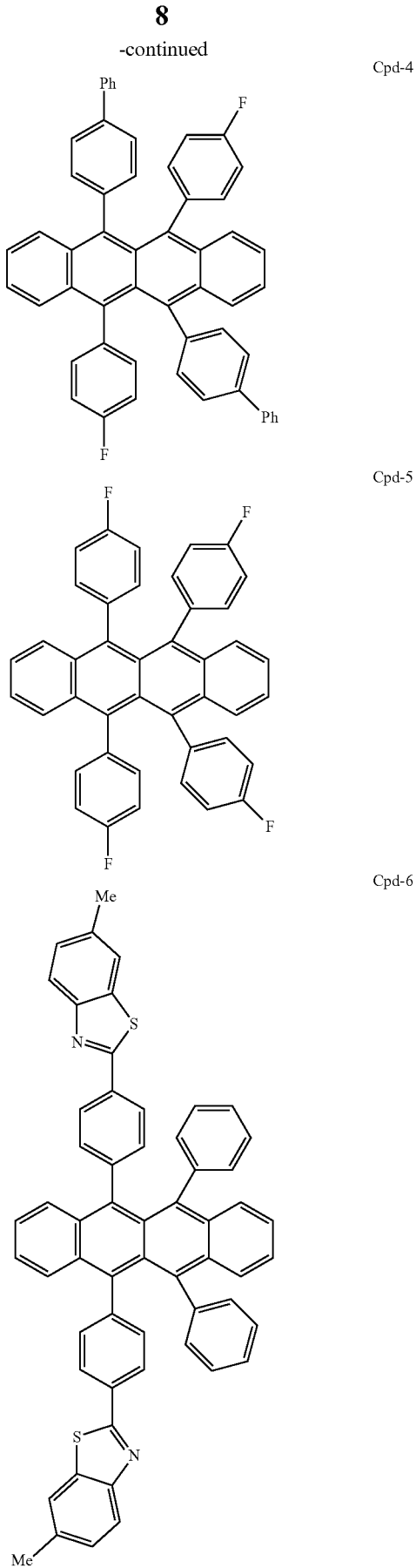

-continued

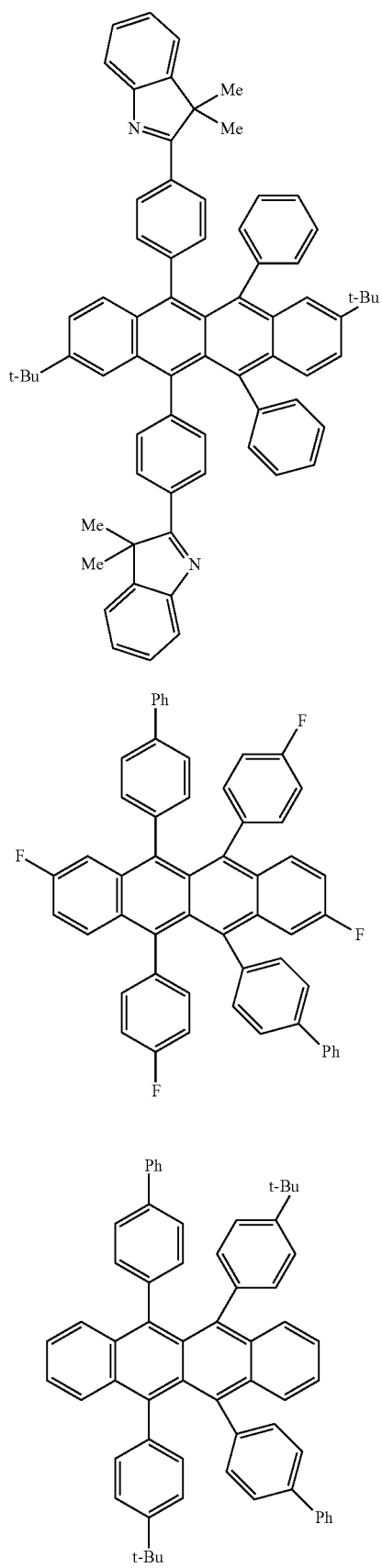

Cpd-7

Cpd-11

Cpd-15

-continued

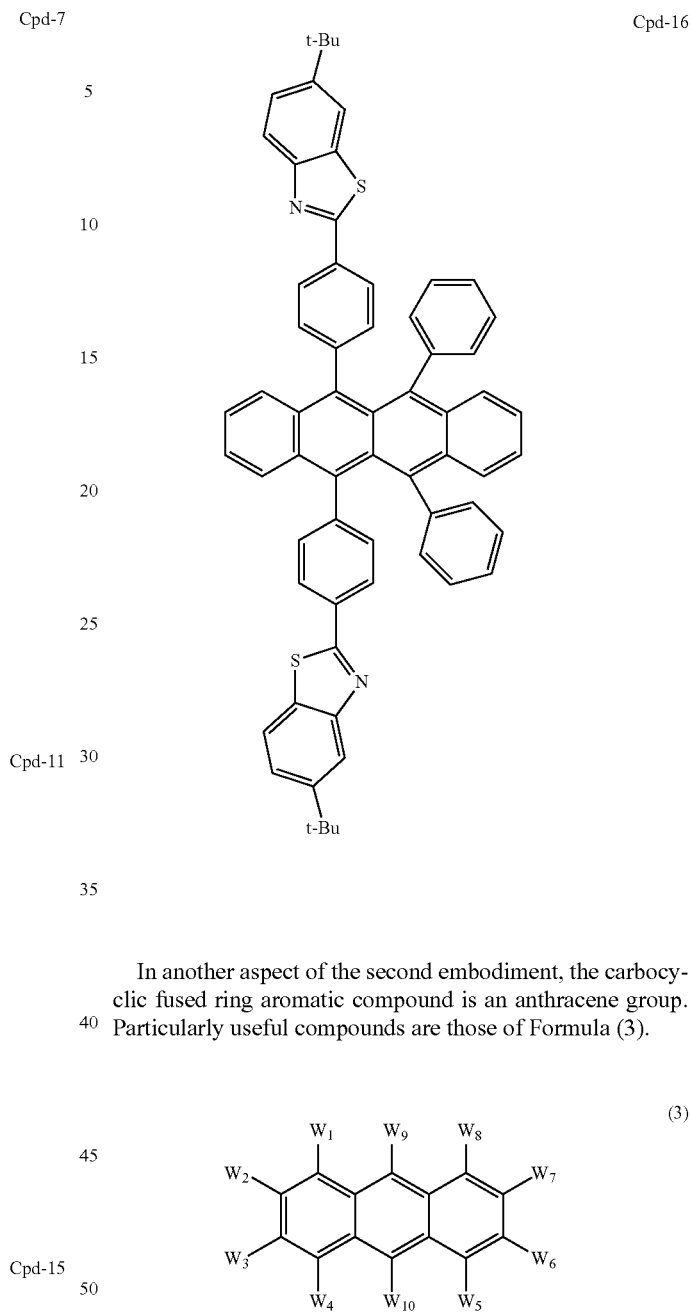

Cpd-16

In another aspect of the second embodiment, the carbocyclic fused ring aromatic compound is an anthracene group. Particularly useful compounds are those of Formula (3).

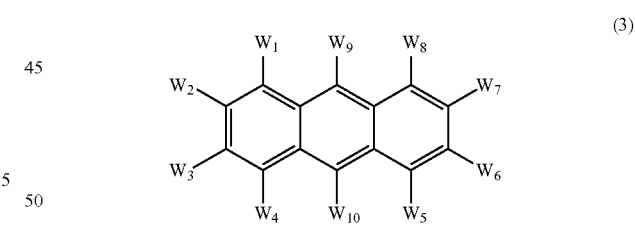

(3)

In Formula (3), $W_9$ and $W_{10}$ represent independently selected aromatic carbocyclic and aromatic heterocyclic groups. Preferably, $W_9$ and $W_{10}$ are independently selected from phenyl, naphthyl and biphenyl groups. For example, $W_9$ and $W_{10}$ may represent such groups as 1-naphthyl, 2-naphthyl, 4-biphenyl, 2-biphenyl and 3-biphenyl. $W_1$-$W_8$ represent are independently selected hydrogen, alkyl, aromatic carbocyclic and aromatic heterocyclic groups, preferably hydrogen, tertiary alkyl and aryl groups. Particularly useful embodiments of the invention are when $W_9$ and $W_{10}$ are aromatic carbocyclic groups and $W_7$ and $W_3$ are independently selected from hydrogen, alkyl and aryl groups. Most preferably, $W_7$ is hydrogen, a tertiary alkyl or an aryl group and $W_3$ is hydrogen.

Some illustrative examples of anthracenes that are useful are as follows:
Cpd-8
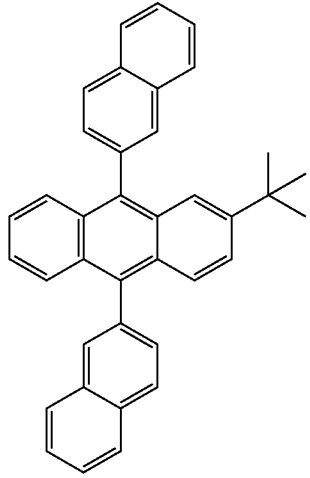
Cpd-9
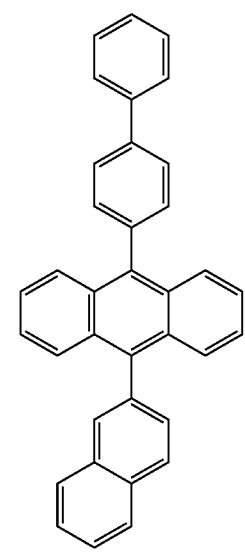
Cpd-10
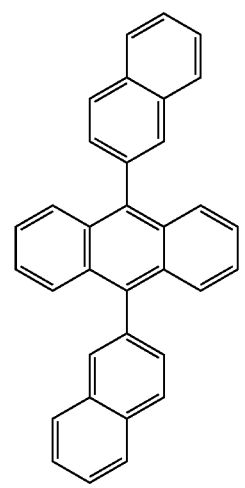
Cpd-12
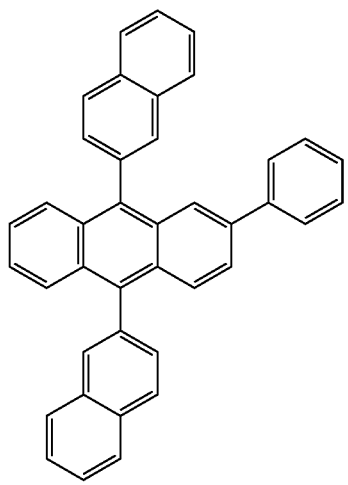
Cpd-13
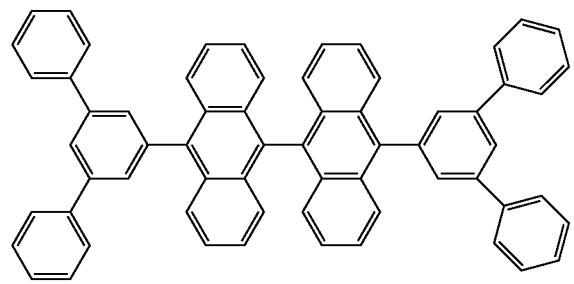
Cpd-22
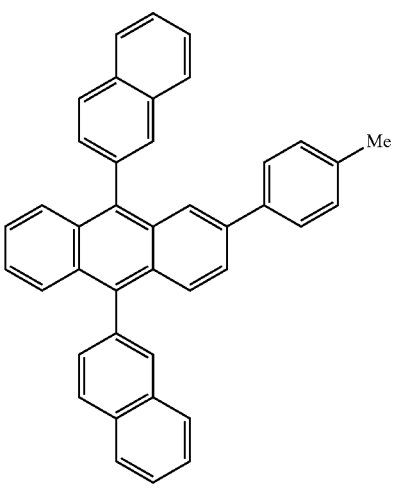

Cpd-23

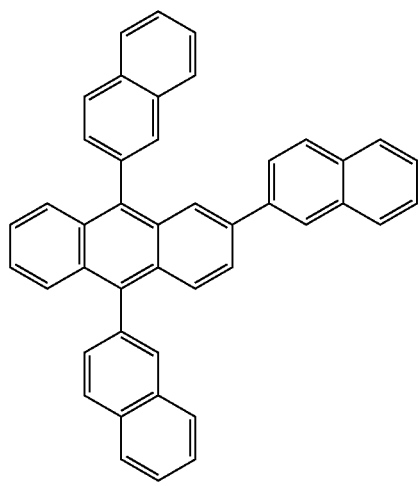

Cpd-24

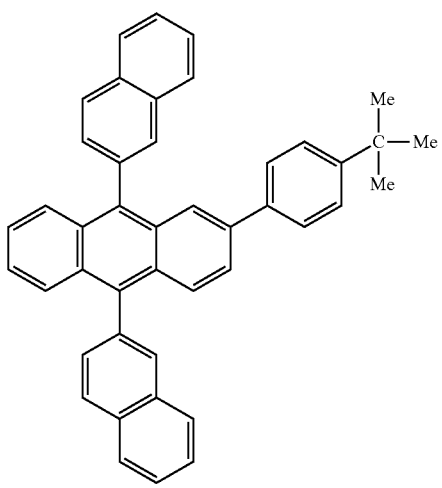

Cpd-25

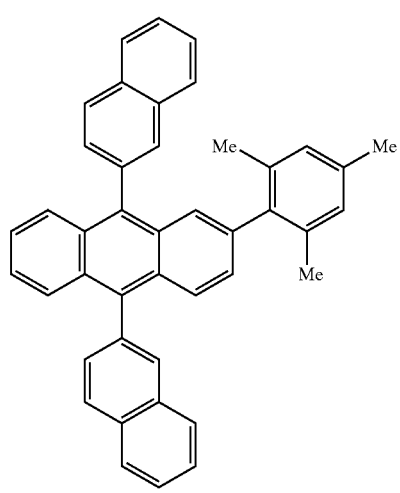

Cpd-26

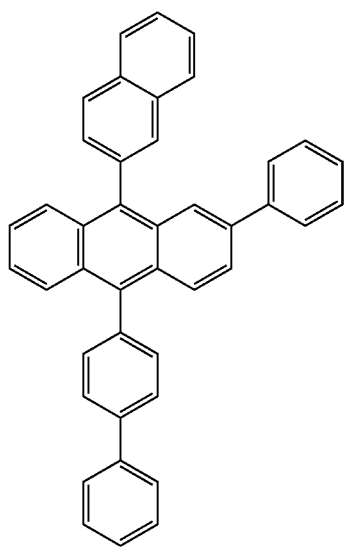

Cpd-27

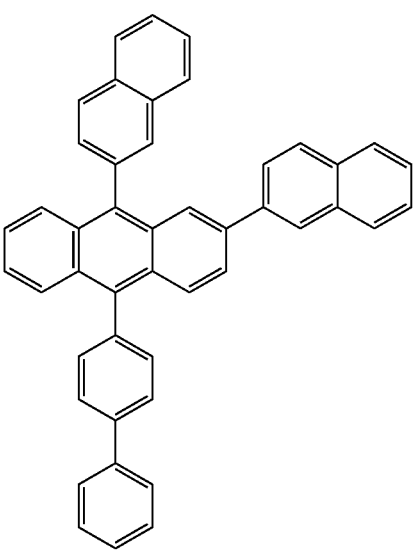

Cpd-28

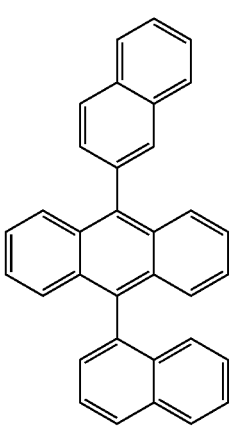

The further layer does not emit light. By this it is meant that the layer does not emit substantial amounts of light. Suitably, this layer emits less than 5% of the total light, or even less than 1% of the light and desirably it emits no light at all. It should be understood that in the most general case, other electron transporting materials other than fused ring aromatic compounds including organic metal complexes not of Formula (MC) such as Formula (5), may be present. In such cases, it is preferred that the Formula (MC) be present at 10% or more by volume. When it is the only layer between the cathode and the light emitting layer, the thickness of the further layer may generally be between 0.5 and 200 nm, suitably between 2 and 100 nm, and desirably between 5 and 50 nm.

In another embodiment of the invention, the further layer is directly adjacent to and in contact with the cathode and contains an additional layer, located between the further layer and the light-emitting layer. Desirably, the additional layer includes an anthracene. Suitable anthracenes for the additional layer are the same as those described for use in the further layer. The additional layer may contain other electron transporting materials including organic metal complexes, preferably those according to Formula (MC), Formula (4') or Formula (5), in addition to the anthracene. It is desirable that the additional layer contain at least 50% or more of the anthracene.

For this application, the thickness of the further layer with the alkali metal or alkaline earth metal salt of a 2-(2-hydroxyphenyl)phenanthroline derivative should be thin and generally be between 0.5 and 50 nm, suitably between 1 and 10 nm, and desirably 5 nm or less.

In yet another embodiment of the invention, the further layer is directly adjacent to the light-emitting layer and further includes an additional layer, located between the further layer and the cathode, which contains a cyclometalled complex of an organic alkali or alkaline earth metal complex represented by Formula (4')

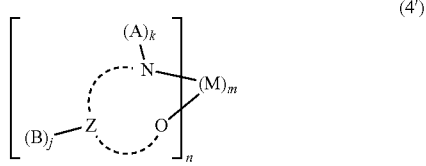

wherein:

Z and the dashed arc represent two or three atoms and the bonds necessary to complete a 5- or 6-membered ring with M;

each A represents H or a substituent and each B represents an independently selected substituent on the Z atoms, provided that two or more substituents may combine to form a fused ring or a fused ring system;

j is 0-3 and k is 1 or 2;

M represents an alkali or alkaline earth metal; and m and n are independently selected integers selected to provide a neutral charge on the complex.

One preferred material according to Formula (4') are the 2-(2-hydroxyphenyl)phenanthroline derivative according to Formula (MC). The same 2-(2-hydroxyphenyl)phenanthroline derivative can be present in both the further layer and the additional layer, or they may be different derivatives in each layer. Other preferred materials according to Formula (4') are those represented by Formula (5):

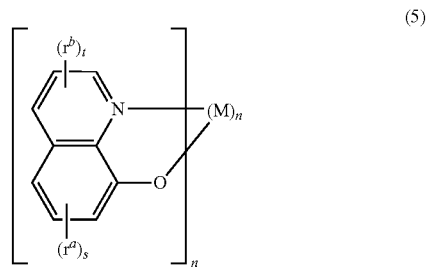

In Formula (5), M represents an alkali or alkaline earth metal, as described previously. In one desirable embodiment, M represents $Li^+$. Each $r^a$ and $r^b$ represents an independently selected substituent, provided two substituents may combine to form a fused ring group. Examples, of such substituents include a methyl group, a phenyl group, a fluoro substituent and a fused benzene ring group formed by combining two substituents. In Formula (5), t is 1-3, s is 1-3 and n is an integer from 1 to 6.

A particularly desirable complex of Formula (5) is MC-1 (Liq). Liq is a complex of $Li^+$ with 8-hydroxyquinolinate, to give the lithium quinolate complex, also known as lithium 8-quinolate, but often referred to as Liq. Liq can exist as the single species, or in other forms such as $Li_6q_6$ and $Li_nq_n$, where n is an integer and q is the 8-hydroxyquinolate ligand or a derivative Some illustrative examples of metal complexes of Formula (4') are the same as those included in Formula (MC) and well as the following:

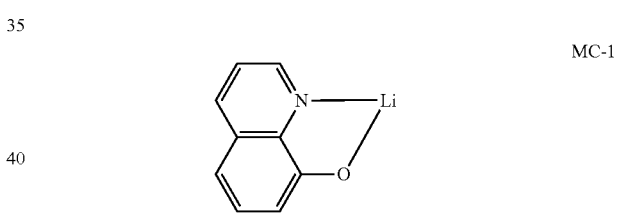

MC-1

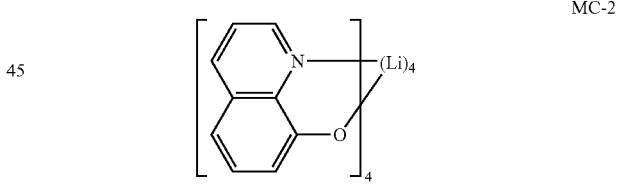

MC-2

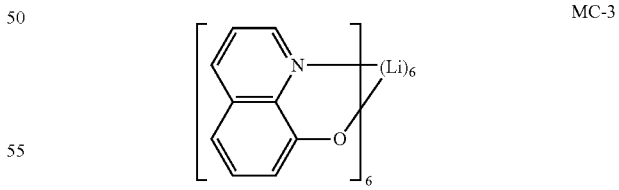

MC-3

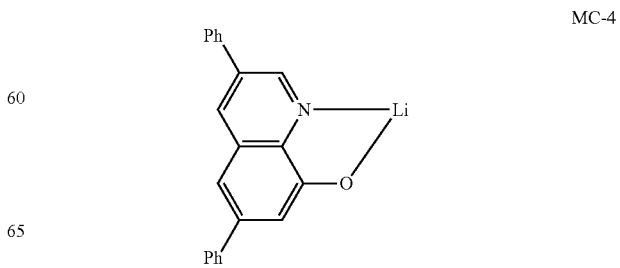

MC-4

-continued

MC-5

MC-6

MC-7

MC-8

MC-9

MC-10

MC-11

MC-12

MC-13

MC-14

MC-15

MC-21

MC-22

MC-23

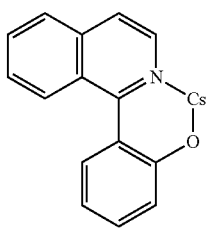

MC-28

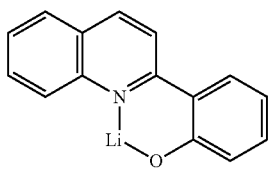

MC-29

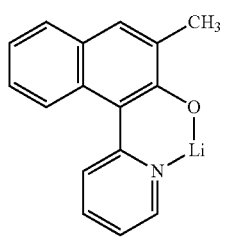

MC-30

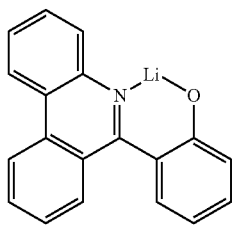

The architecture of the OLED devices of all aspects of the invention can be constructed, by the careful selection of hosts and dopants (also known as light emitting materials), so that the devices can be made to emit blue, green, red or white light. Additionally, the device can include two or more light-emitting layers, for example such as in a tandem EL device that produces white light. In all described aspects of the invention, it should be understood that the inventive layer, further layer and additional layer applies to OLED devices that emit light by both fluorescence and phosphorescence. In other words, the OLED devices can be triple or singlet in nature. The advantages of the invention can be realized with both fluorescent and phosphorescent devices.

In another aspect of the invention, the inventive layer also includes an elemental metal having a work function less than 4.2 eV. The definition of work function can be found in *CRC Handbook of Chemistry and Physics,* 70th Edition, 1989-1990, CRC Press Inc., page F-132 and a list of the work functions for various metals can be found on pages E-93 and E-94. Typical examples of such metals include Li, Na, K, Be, Mg, Ca, Sr, Ba, Y, La, Sm, Gd, Yb. In one desirable embodiment the metal is Li. When included in the layer, the elemental metal is often present in the amount of from 0.1% to 15%, commonly in the amount of 0.1% to 10%, and often in the amount of 1 to 5% by volume of the total material in the layer.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in many EL device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure according to the present invention and especially useful for a small molecule device, is shown in FIG. 1 and is comprised of a substrate 101, an anode 103, a hole-injecting layer 105, a hole-transporting layer 107, a light-emitting layer 109, an electron-transporting layer 111, an electron injecting layer 112, and a cathode 113. These layers are described in detail below. Note that the substrate 101 may alternatively be located adjacent to the cathode 113, or the substrate 101 may actually constitute the anode 103 or cathode 113. The organic layers between the anode 103 and cathode 113 are conveniently referred to as the organic EL element. Also, the total combined thickness of the organic layers is desirably less than 500 nm. If the device includes phosphorescent material, a hole-blocking layer, located between the light-emitting layer and the electron-transporting layer, may be present.

The anode 103 and cathode 113 of the OLED are connected to a voltage/current source 150 through electrical conductors 160. The OLED is operated by applying a potential between the anode 103 and cathode 113 such that the anode 103 is at a more positive potential than the cathode 113. Holes are injected into the organic EL element from the anode 103 and electrons are injected into the organic EL element at the cathode 113. Enhanced device stability can sometimes be achieved when the OLED is operated in an AC mode where, for some time period in the AC cycle, the potential bias is reversed and no current flows. An example of an AC driven OLED is described in U.S. Pat. No. 5,552,678.

Substrate

The OLED device of this invention is typically provided over a supporting substrate 101 where either the cathode 113 or anode 103 can be in contact with the substrate. The electrode in contact with the substrate 101 is conveniently referred to as the bottom electrode. Conventionally, the bottom electrode is the anode 103, but this invention is not limited to that configuration. The substrate 101 can either be light transmissive or opaque, depending on the intended direction of light emission. The light transmissive property is desirable for viewing the EL emission through the substrate 101. Transparent glass or plastic is commonly employed in such cases. The substrate 101 can be a complex structure comprising multiple layers of materials. This is typically the case for active matrix substrates wherein TFTs are provided below the OLED layers. It is still necessary that the substrate 101, at least in the emissive pixelated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials such as silicon, ceramics, and circuit board materials. Again, the substrate 101 can be a complex structure comprising multiple layers of materials such as found in active matrix TFT designs. It is necessary to provide in these device configurations a light-transparent top electrode.

Anode

When the desired electroluminescent light emission (EL) is viewed through the anode, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. For applications where EL emission is viewed only through the cathode 113, the transmissive characteristics of the anode 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable methods such as evaporation, sputtering, chemical vapor deposition, or electrochemical. Anodes can be patterned using well-known photolithographic processes. Optionally, anodes may be polished prior to application of other layers to reduce surface roughness so as to reduce short circuits or enhance reflectivity.

Cathode

When light emission is viewed solely through the anode 103, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EIL) in contact with an organic layer (e.g., an electron transporting layer (ETL)), the cathode being capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode 113 must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-Injecting Layer (HIL)

Depending on the aspect of the invention, the device may include a HIL of the invention or an HIL as known in the art, or both. A hole-injecting layer 105 may be provided between anode 103 and hole-transporting layer 107. The hole-injecting layer can serve to improve the film formation property of subsequent organic layers and to facilitate injection of holes into the hole-transporting layer 107. Suitable materials for use in the hole-injecting layer 105 include, but are not limited to, porphyrinic compounds as described in U.S. Pat. No. 4,720,432, plasma-deposited fluorocarbon polymers as described in U.S. Pat. No. 6,208,075, and some aromatic amines, for example, MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1. A hole-injection layer is conveniently used in the present invention, and is desirably a plasma-deposited fluorocarbon polymer. The thickness of a hole-injection layer containing a plasma-deposited fluorocarbon polymer can be in the range of 0.2 nm to 15 nm and suitably in the range of 0.3 to 1.5 nm.

Hole-Transporting Layer (HTL)

While not always necessary, it is often useful to include a hole-transporting layer in an OLED device. The hole-transporting layer 107 of the organic EL device contains at least one hole-transporting compound such as an aromatic tertiary amine. An aromatic tertiary amine is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals comprising at least one active hydrogen containing group are disclosed by Brantley et al U.S. Pat. Nos. 3,567,450 and 3,658,520.

A more preferred class of aromatic tertiary amines is those which include at least two aromatic tertiary amine moieties as described in U.S. Pat. Nos. 4,720,432 and 5,061,569. Such compounds include those represented by structural formula (A).

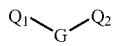

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

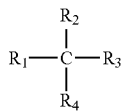

B where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by formula (C), linked through an arylene group. Useful tetraaryldiamines include those represented by formula (D).

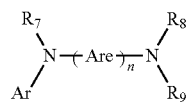

D wherein
each Are is an independently selected arylene group, such as a phenylene or anthracene moiety,
n is an integer of from 1 to 4, and
Ar, $R_7$, $R_8$, and $R_9$ are independently selected aryl groups.
In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halide such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single tertiary amine compound or a mixture of such compounds. Specifically, one may employ a triarylamine, such as a triarylamine satisfying the formula (B), in combination with a tetraaryldiamine, such as indicated by formula (D). Illustrative of useful aromatic tertiary amines are the following:
1,1-Bis(4-di-p-tolylaminophenyl)cyclohexane (TAPC)
1,1-Bis(4-di-p-tolylaminophenyl)-4-methylcyclohexane
1,1-Bis(4-di-p-tolylaminophenyl)-4-phenylcyclohexane
1,1-Bis(4-di-p-tolylaminophenyl)-3-phenylpropane (TAPPP)
N,N,N',N'-tetraphenyl-4,4'''-diamino-1,1':4',1'':4'',1'''-quaterphenyl
Bis(4-dimethylamino-2-methylphenyl)phenylmethane
1,4-bis[2-[4-[N,N-di(p-toly)amino]phenyl]vinyl]benzene (BDTAPVB)
N,N,N',N'-Tetra-p-tolyl-4,4'-diaminobiphenyl (TTB)
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4''-diamino-p-terphenyl
4,4'-Bis{N-phenyl-N-[4-(1-naphthyl)-phenyl]amino}biphenyl
2,6-Bis[N,N-di(2-naphthyl)amino]fluorene
4,4',4''-tris[(3-methylphenyl)phenylamino]triphenylamine (MTDATA)
4,4'-Bis[N-(3-methylphenyl)-N-phenylamino]biphenyl (TPD)

Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS. It is also possible for the hole-transporting layer to comprise two or more sublayers of differing compositions, the composition of each sublayer being as described above. The thickness of the hole-transporting layer can be between 10 and about 500 nm and suitably between 50 and 300 nm.

Light-Emitting Layer (LEL)

As more fully described in U.S. Pat. Nos. 4,769,292 and 5,935,721, the light-emitting layer (LEL) of the organic EL element includes a luminescent material where electroluminescence is produced as a result of electron-hole pair recombination. The light-emitting layer can be comprised of a single material, but more commonly consists of a host material doped with a guest emitting material or materials where light emission comes primarily from the emitting materials and can be of any color. The host materials in the light-emitting layer can be an electron-transporting material, as defined below, a hole-transporting material, as defined above, or another material or combination of materials that support hole-electron recombination. Fluorescent emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small-molecule emitting materials can be molecularly dispersed into a polymeric host, or the emitting materials can be added by copolymerizing a minor constituent into a host polymer. Host materials may be mixed together in order to improve film formation, electrical properties, light emission efficiency, operating lifetime, or manufacturability. The host may comprise a material that has good hole-transporting properties and a material that has good electron-transporting properties.

An important relationship for choosing a fluorescent material as a guest emitting material is a comparison of the excited singlet-state energies of the host and the fluorescent material. It is highly desirable that the excited singlet-state energy of the fluorescent material be lower than that of the host material. The excited singlet-state energy is defined as the difference in energy between the emitting singlet state and the ground state. For non-emissive hosts, the lowest excited state of the same electronic spin as the ground state is considered the emitting state.

Host and emitting materials known to be of use include, but are not limited to, those disclosed in U.S. Pat. No. 4,768,292, U.S. Pat. No. 5,141,671, U.S. Pat. No. 5,150,006, U.S. Pat. No. 5,151,629, U.S. Pat. No. 5,405,709, U.S. Pat. No. 5,484,922, U.S. Pat. No. 5,593,788, U.S. Pat. No. 5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives, also known as metal-chelated oxinoid compounds (Formula E), constitute one class of useful host compounds capable of supporting electroluminescence, and are particularly suitable for light emission of wavelengths longer than 500 nm, e.g., green, yellow, orange, and red.

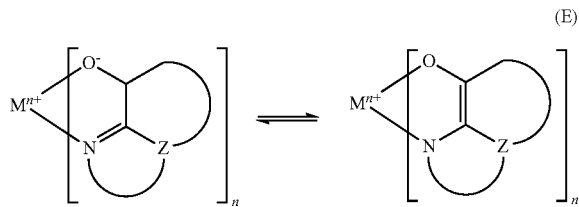

(E)

wherein

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; a trivalent metal, such aluminum or gallium, or another metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine[alias, tris(8-quinolinolato)aluminum(III)]

CO-2: Magnesium bisoxine[alias, bis(8-quinolinolato)magnesium(II)]

CO-3: Bis[benzo{f}-8-quinolinolato]zinc (II)

CO-4: Bis(2-methyl-8-quinolinolato)aluminum(III)-oxo-bis(2-methyl-8-quinolinolato)aluminum(III)

CO-5: Indium trisoxine[alias, tris(8-quinolinolato)indium]

CO-6: Aluminum tris(5-methyloxine) [alias, tris(5-methyl-8-quinolinolato)aluminum(III)]

CO-7: Lithium oxine[alias, (8-quinolinolato)lithium(I)]

CO-8: Gallium oxine[alias, tris(8-quinolinolato)gallium (III)]

CO-9: Zirconium oxine[alias, tetra(8-quinolinolato)zirconium(IV)]

Derivatives of 9,10-di-(2-naphthyl)anthracene (Formula F1) constitute one class of useful host materials capable of supporting electroluminescence, and are particularly suitable for light emission of wavelengths longer than 400 nm, e.g., blue, green, yellow, orange or red.

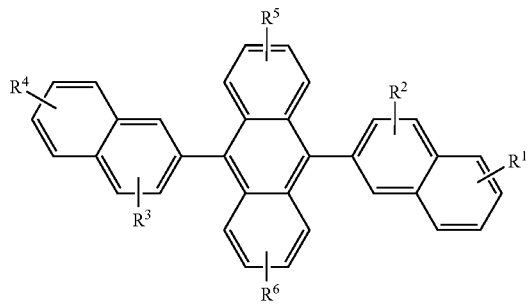

(F1)

wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Styrylarylene derivatives as described in U.S. Pat. No. 5,121,029 and JP 08333569 are also useful hosts for blue emission. For example, 9,10-bis[4-(2,2-diphenylethenyl)phenyl]anthracene and 4,4'-bis(2,2-diphenylethenyl)-1,1'-biphenyl(DPVBi) are useful hosts for blue emission.

Benzazole derivatives (Formula G) constitute another class of useful host materials capable of supporting electroluminescence, and are particularly suitable for light emission of wavelengths longer than 400 nm, e.g., blue, green, yellow, orange or red.

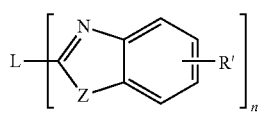 (G)

wherein:

n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which connects the multiple benzazoles together. L may be either conjugated with the multiple benzazoles or not in conjugation with them. An example of a useful benzazole is 2,2',2''-(1,3,5-phenylene)tris[1-phenyl-1H-benzimidazole].

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)imine boron compounds, bis(azinyl)methene compounds, and carbostyryl compounds. Illustrative examples of useful materials include, but are not limited to, the following:

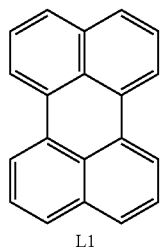
L1

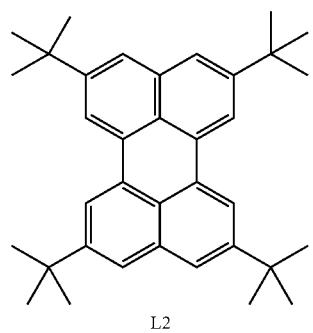
L2

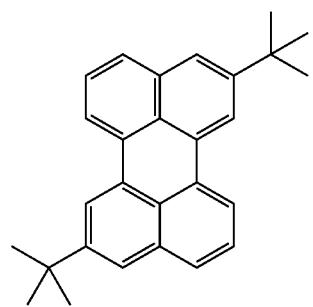 [SMILES: CC(C)(C)c1cc2cccc3c4cc(C(C)(C)C)cc5cccc(c(c1)c23)c54]
L3

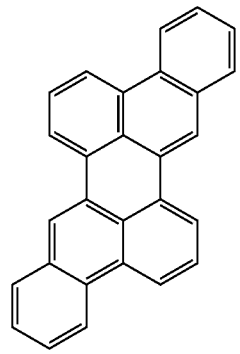 [SMILES: c1ccc2c(c1)cc1c3cccc4c5ccccc5cc(c5cccc2c51)c43]
L4

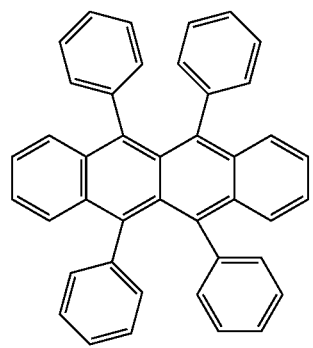 [SMILES: c1ccc(-c2c3ccccc3c(-c3ccccc3)c3c(-c4ccccc4)c4ccccc4c(-c4ccccc4)c23)cc1]
L5

-continued

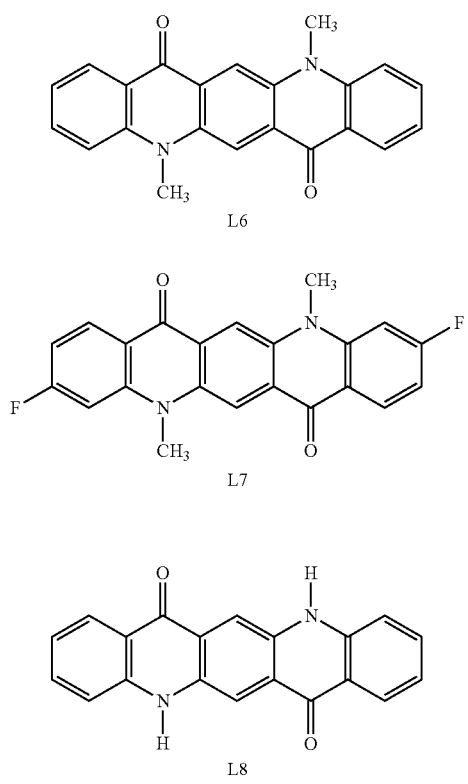

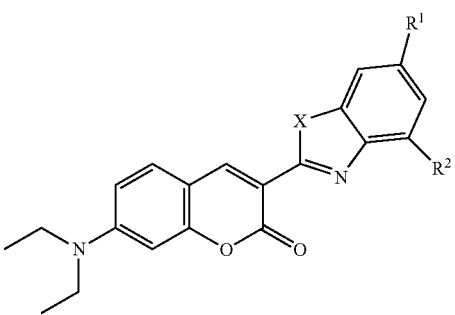

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

-continued

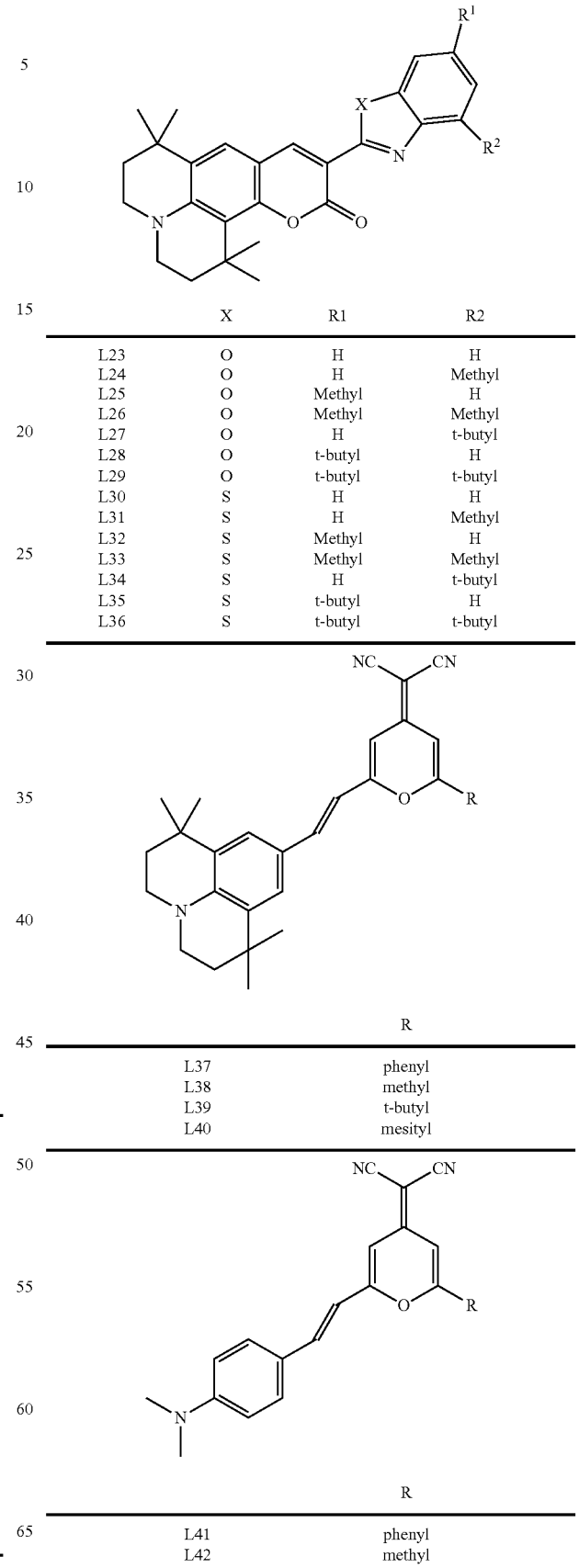

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

| | R |
|---|---|
| L37 | phenyl |
| L38 | methyl |
| L39 | t-butyl |
| L40 | mesityl |

| | R |
|---|---|
| L41 | phenyl |
| L42 | methyl |

| | |
|---|---|
| L43 | t-butyl |
| L44 | mesityl |
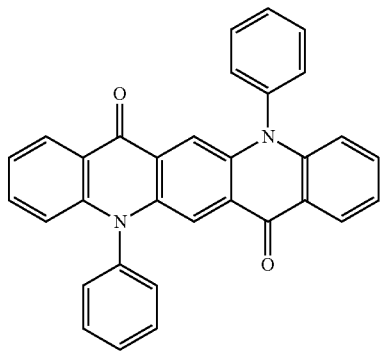 [SMILES: O=c1c2ccccc2n(-c2ccccc2)c2cc3c(=O)c4ccccc4n(-c4ccccc4)c3cc12]
L45
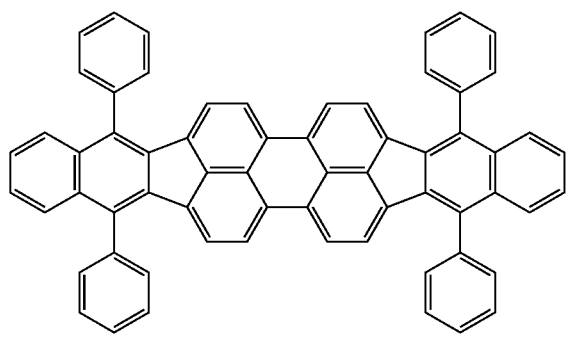 [SMILES: c1ccc(-c2c3c(c(-c4ccccc4)c4ccccc24)-c2ccc4c5ccc6c7c(ccc(c8ccc-3c2c84)c75)-c2c-6c(-c3ccccc3)c3ccccc3c2-c2ccccc2)cc1]
L46
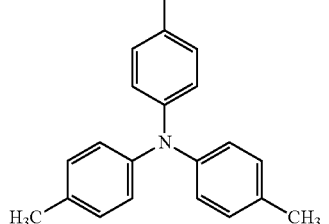
L47
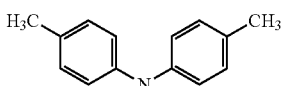
L48
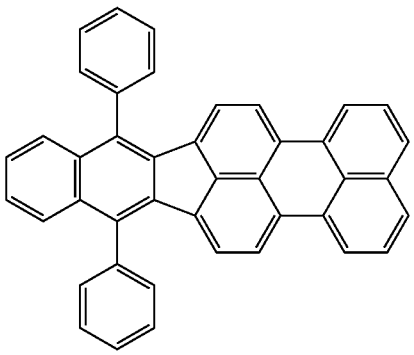 [SMILES: c1ccc(-c2c3c(c(-c4ccccc4)c4ccccc24)-c2ccc4c5cccc6cccc(c7ccc-3c2c74)c65)cc1]
L49
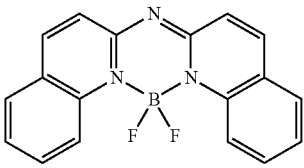
L50
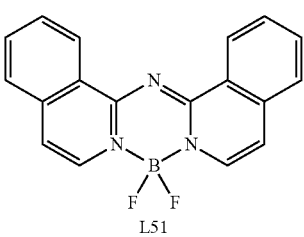
L51

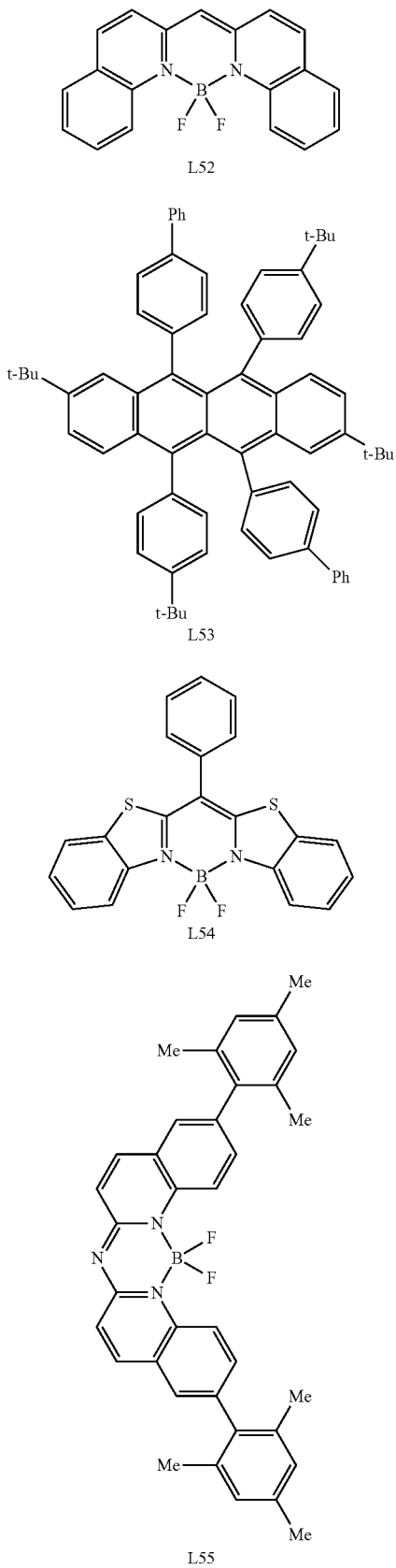

L52

L53

L54

L55

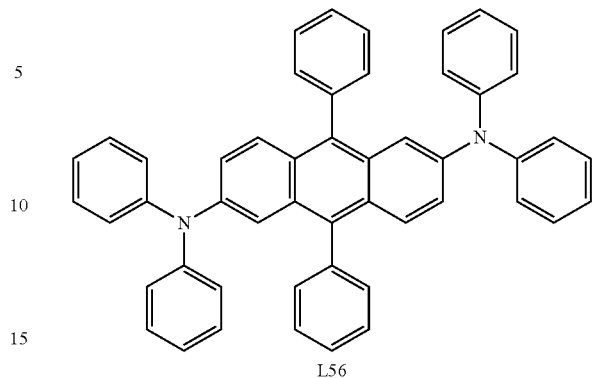

L56

Light-emitting phosphorescent materials may be used in the EL device. For convenience, the phosphorescent complex guest material may be referred to herein as a phosphorescent material. The phosphorescent material typically includes one or more ligands, for example monoanionic ligands that can be coordinated to a metal through an $sp^2$ carbon and a heteroatom. Conveniently, the ligand can be phenylpyridine (ppy) or derivatives or analogs thereof. Examples of some useful phosphorescent organometallic materials include tris(2-phenylpyridinato-N,$C^{2'}$)iridium(III), bis(2-phenylpyridinato-N,$C^2$)iridium(III)(acetylacetonate), and bis(2-phenylpyridinato-N,$C^{2'}$)platinum(II). Usefully, many phosphorescent organometallic materials emit in the green region of the spectrum, that is, with a maximum emission in the range of 510 to 570 nm.

Phosphorescent materials may be used singly or in combinations other phosphorescent materials, either in the same or different layers. Phosphorescent materials and suitable hosts are described in WO 00/57676, WO 00/70655, WO 01/41512 A1, WO 02/15645 A1, US 2003/0017361 A1, WO 01/93642 A1, WO 01/39234 A2, U.S. Pat. No. 6,458,475 B1, WO 02/071813 A1, U.S. Pat. No. 6,573,651 B2, US 2002/0197511 A1, WO 02/074015 A2, U.S. Pat. No. 6,451,455 B1, US 2003/0072964 A1, US 2003/0068528 A1, U.S. Pat. No. 6,413,656 B1, U.S. Pat. No. 6,515,298 B2, U.S. Pat. No. 6,451,415 B1, U.S. Pat. No. 6,097,147, US 2003/0124381 A1, US 2003/0059646 A1, US 2003/0054198 A1, EP 1 239 526 A2, EP 1 238 981 A2, EP 1 244 155 A2, US 2002/0100906 A1, US 2003/0068526 A1, US 2003/0068535 A1, JP 2003073387A, JP 2003 073388A, US 2003/0141809 A1, US 2003/0040627 A1, JP 2003059667A, JP 2003073665A, and US 2002/0121638 A1.

The emission wavelengths of cyclometallated Ir(III) complexes of the type $IrL_3$ and $IrL_2L_1'$, such as the green-emitting fac-tris(2-phenylpyridinato-N,$C^{2'}$)iridium(III) and bis(2-phenylpyridinato-N,$C^{2'}$)iridium(III)(acetylacetonate) may be shifted by substitution of electron donating or withdrawing groups at appropriate positions on the cyclometallating ligand L, or by choice of different heterocycles for the cyclometallating ligand L. The emission wavelengths may also be shifted by choice of the ancillary ligand $L_1$. Examples of red emitters are the bis(2-(2'-benzothienyl)pyridinato-N,$C^{3'}$)iridium(III)(acetylacetonate) and tris(2-phenylisoquinolinato-N,$C^{2'}$)iridium(III). A blue-emitting example is bis(2-(4,6-difluorophenyl)-pyridinato-N,$C^{2'}$)iridium(III)(picolinate).

Red electrophosphorescence has been reported, using bis (2-(2'-benzo[4,5-a]thienyl)pyridinato-N,$C^3$) iridium (acetylacetonate) [$Btp_2Ir(acac)$] as the phosphorescent material (C. Adachi, S. Lamansky, M. A. Baldo, R. C. Kwong, M. E. Thompson, and S. R. Forrest, App. Phys. Lett., 78, 1622-1624 (2001)).

Other important phosphorescent materials include cyclometallated Pt(II) complexes such as cis-bis(2-phenylpyridinato-N,C$^{2'}$)platinum(II), cis-bis(2-(2'-thienyl)pyridinato-N, C$^{3'}$) platinum(II), cis-bis(2-(2'-thienyl)quinolinato-N,C$^{5'}$) platinum(II), or (2-(4,6-difluorophenyl)pyridinato-N,C$^{2'}$) platinum (II) (acetylacetonate). Pt (II) porphyrin complexes such as 2,3,7,8,12,13,17,18-octaethyl-21H,23H-porphine platinum(II) are also useful phosphorescent materials.

Still other examples of useful phosphorescent materials include coordination complexes of the trivalent lanthanides such as Tb$^{3+}$ and Eu$^{3+}$ (J. Kido et al., Appl. Phys. Lett., 65, 2124 (1994)).

Suitable host materials for phosphorescent materials should be selected so that transfer of a triplet exciton can occur efficiently from the host material to the phosphorescent material but cannot occur efficiently from the phosphorescent material to the host material. Therefore, it is highly desirable that the triplet energy of the phosphorescent material be lower than the triplet energy of the host. Generally speaking, a large, triplet energy implies a large optical bandgap. However, the band gap of the host should not be chosen so large as to cause an unacceptable barrier to injection of charge carriers into the light-emitting layer and an unacceptable increase in the drive voltage of the OLED. Suitable host materials are described in WO 00/70655 A2; WO 01/39234 A2; WO 01/93642 A1; WO 02/074015 A2; WO 02/15645 A1, and US 2002/0117662. Suitable hosts include certain aryl amines, triazoles, indoles and carbazole compounds. Examples of desirable hosts are 4,4'-N,N'-dicarbazole-biphenyl, otherwise known as 4,4'-bis(carbazol-9-yl)biphenyl or CBP; 4,4'-N,N'-dicarbazole-2,2'-dimethyl-biphenyl, otherwise known as 2,2'-dimethyl-4,4'-bis(carbazol-9-yl)biphenyl or CDBP; 1,3-bis(N,N'-dicarbazole)benzene, otherwise known as 1,3-bis(carbazol-9-yl)benzene, and poly(N-vinylcarbazole), including their derivatives.

Desirable host materials are capable of forming a continuous film.

Hole-Blocking Layer (HBL)

In addition to suitable hosts, an OLED device employing a phosphorescent material often requires at least one hole-blocking layer placed between the electron-transporting layer 111 and the light-emitting layer 109 to help confine the excitons and recombination events to the light-emitting layer comprising the host and phosphorescent material. In this case, there should be an energy barrier for hole migration from the host into the hole-blocking layer, while electrons should pass readily from the hole-blocking layer into the light-emitting layer comprising a host and a phosphorescent material. The first requirement entails that the ionization potential of the hole-blocking layer be larger than that of the light-emitting layer 109, desirably by 0.2 eV or more. The second requirement entails that the electron affinity of the hole-blocking layer, not greatly exceed that of the light-emitting layer 109, and desirably be either less than that of light-emitting layer or not exceed that of the light-emitting layer by more than about 0.2 eV.

When used with an electron-transporting layer whose characteristic luminescence is green, such as an Alq-containing electron-transporting layer as described below, the requirements concerning the energies of the highest occupied molecular orbital (HOMO) and lowest unoccupied molecular orbital (LUMO) of the material of the hole-blocking layer frequently result in a characteristic luminescence of the hole-blocking layer at shorter wavelengths than that of the electron-transporting layer, such as blue, violet, or ultraviolet luminescence. Thus, it is desirable that the characteristic luminescence of the material of a hole-blocking layer be blue, violet, or ultraviolet. It is further desirable, but not absolutely required, that the triplet energy of the hole-blocking material be greater than that of the phosphorescent material. Suitable hole-blocking materials are described in WO 00/70655A2 and WO 01/93642 A1. Two examples of useful hole-blocking materials are bathocuproine (BCP) and bis(2-methyl-8-quinolinolato)(4-phenylphenolato)aluminum(III) (BAlq).

The characteristic luminescence of BCP is in the ultraviolet, and that of BAlq is blue. Metal complexes other than BAlq are also known to block holes and excitons as described in US Patent Publication 2003/0068528. In addition, US Patent Publication 2003/0175553 A1 describes the use of fac-tris(1-phenylpyrazolato-N,C$^2$)iridium(III) (Irppz) for this purpose.

When a hole-blocking layer is used, its thickness can be between 2 and 100 nm and suitably between 5 and 10 nm.

Electron-Transporting Layer (ETL)

Electron-transporting layers are located between the light emitting layer and the cathode. In one embodiment, the layer of the invention functions as the electron-transporting layer of the device. In other embodiments it may be desirable to have additional electron-transporting layers as described below.

Desirable thin film-forming materials for use in forming electron-transporting layer of organic EL devices are metal-chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary of contemplated oxinoid compounds are those satisfying structural formula (E), previously described.

Other electron-transporting materials suitable for use in the electron-transporting layer include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines are also known to be useful as electron transporting materials.

If both a hole-blocking layer and an electron-transporting layer 111 are used, electrons should pass readily from the electron-transporting layer 111 into the hole-blocking layer. Therefore, the electron affinity of the electron-transporting layer 111 should not greatly exceed that of the hole-blocking layer. Desirably, the electron affinity of the electron-transporting layer should be less than that of the hole-blocking layer or not exceed it by more than about 0.2 eV.

If an electron-transporting layer is used, its thickness may be between 2 and 100 nm and suitably between 5 and 20 nm.

Electron-Injecting Layer (EIL)

Electron-injecting layers are located adjacent to the cathode. In one embodiment, the layer of the invention functions as the electron-injecting layer of the device. In other embodiments it may be desirable to have additional electron-injecting layers as described below. Electron-injecting layers include those taught in U.S. Pat. Nos. 5,608,287; 5,776,622; 5,776,623; 6,137,223; and 6,140,763. An electron-injecting layer generally consists of an electron-injecting material having a work function less than 4.2 eV or the salt of a metal having a work function less than 4.2 eV. A thin-film containing low work-function alkaline metals or alkaline earth metals, such as Li, Na, K, Rb, Cs, Ca, Mg, Sr and Ba can be employed. In addition, an organic material doped with these low work-function metals can also be used effectively as the electron-injecting layer. Examples are Li- or Cs-doped Alq. In one suitable embodiment, the electron-injecting layer includes alkali and alkaline earth metal inorganic salts, including their oxides. Also included are alkali and alkaline earth metal organic salts and complexes. In fact, any metal salt or compound which can be reduced in the device to liberate its free metal, either as a free entity or a transient species, are useful in the electron-injecting layer. Examples include, lithium fluoride (LiF), sodium fluoride (NaF), cesium fluoride (CsF), lithium oxide (Li$_2$O), lithium acetylacetonate (Liacac), lithium benzoate, potassium benzoate, lithium acetate and lithium formate. In practice, the electron-injecting layer is often a thin interfacial layer deposited to a suitable thickness in a range of 0.1-10.0 nm, but more typically in the range of 0.1-5.0 nm. An interfacial electron-injecting layer in this thickness range will provide effective electron injection into the layer or further layer of the invention. Optionally, the electron injecting layer may be omitted from the invention.

Other Useful Organic Layers and Device Architecture

In some instances, layers 109 through 111 can optionally be collapsed into a single layer that serves the function of supporting both light emission and electron transportation. The hole-blocking layer, when present, and layer 111 may also be collapsed into a single layer that functions to block holes or excitons, and supports electron transport. It also known in the art that emitting materials may be included in the hole-transporting layer 107. In that case, the hole-transporting material may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. No. 5,683,823, U.S. Pat. No. 5,503,910, U.S. Pat. No. 5,405,709, and U.S. Pat. No. 5,283,182 and can be equipped with a suitable filter arrangement to produce a color emission.

This invention may be used in so-called stacked device architecture, for example, as taught in U.S. Pat. Nos. 5,703,436 and 6,337,492.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,851,709 and U.S. Pat. No. 6,066,357) and inkjet method (U.S. Pat. No. 6,066,357).

One preferred method for depositing the materials of the present invention is described in US Patent Publication 2004/0255857 and U.S. patent application Ser. No. 10/945,941 where different source evaporators are used to evaporate each of the materials of the present invention. A second preferred method involves the use of flash evaporation where materials are metered along a material feed path in which the material feed path is temperature controlled. Such a preferred method is described in the following co-assigned patent application Ser. Nos. 10/784,585; 10/805,980; 10/945,940; 10/945,941; 11/050,924; and 11/050,934. Using this second method, each material may be evaporated using different source evaporators or the solid materials may be mixed prior to evaporation using the same source evaporator.

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation. Any of these methods of sealing or encapsulation and desiccation can be used with the EL devices constructed according to the present invention.

Optical Optimization

OLED devices of this invention can employ various well-known optical effects in order to enhance their emissive properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the EL device or as part of the EL device.

Embodiments of the invention may provide advantageous features such as higher luminous yield, lower drive voltage, and higher power efficiency, longer operating lifetimes or ease of manufacture. Embodiments of devices useful in the invention can provide a wide range of hues including those useful in the emission of white light (directly or through filters to provide multicolor displays). Embodiments of the invention can also provide an area lighting device.

The invention and its advantages are further illustrated by the specific examples that follow.

EXPERIMENTAL EXAMPLES

The term "percentage" or "percent" and the symbol "%" indicate the volume percent (or a thickness ratio as measured on a thin film thickness monitor) of a particular first or second compound of the total material in the layer of the invention and other components of the devices. If more than one second compound is present, the total volume of the second compounds can also be expressed as a percentage of the total material in the layer of the invention.

Example A

Synthesis of MC-20

2-Chloro-1,10-phenanthroline was prepared from 1,10-phenanthroline according to Halcrow et al., Journal of the Chemical Society (1946), 155-7. Overall yield was approximately 50%

29.5 g 2-chlorophenanthroline was added to a mixture of 25 g 2-methoxyphenylboronic acid, 165 ml 2M sodium carbonate (62 g monohydrate in 250 ml water) in 40 ml EtOH and 300 ml toluene and degassed for 30 min with nitrogen in a 1 L three neck RB flask with mechanical stirring. 5 g of $Pd(Ph_3P)_4$ was added and heated to reflux overnight. These conditions for the coupling reaction are based on McKillop et al, Tetrahedron, 1992, pp 8117-8126. After cooling to RT, 300 ml of toluene was added, the solution filtered through Celite which was washed with EtOAc. The organic phase was separated, washed once with water and dried over magnesium sulfate. The solution was filtered and concentrated to a brown oil. This was dissolved in 80 ml $CH_2Cl_2$ and diluted with 1 L diethylether. 25 ml of (20 ml conc HCl+30 ml EtOH) was added dropwise with mechanical stirring to form a bright yellow precipitate. This was stirred for 1 hr at RT, filtered and washed with diethylether. The crude solid was then recrystallized from 1 L acetonitrile. Yield was 34.1 g after vacuum drying at RT or 77% of theory.

2-(2-Hydroxyphenyl)-1,10-phenanthroline was then synthesized as follows: 320 ml pyridine was added dropwise to 380 ml concentrated HCL in a 1 L 3 neck RB flask with mechanical stirring and equipped with a dean-stark trap under $N_2$. The reaction temperature rose to 100 deg C. The mixture was heated further to a final temperature of 220 deg C. 252 ml of liquid was collected in the trap. The mixture was cooled to RT overnight without stirring to obtain a white solid. 60.5 g of 2-(2-methoxyphenyl)-1,10-phenanthroline was added on top of the solid and the mixture reheated to 220 deg C. (with stirring after the solid melted) for ~2 hrs. An additional 7 ml of liquid was collected in the trap. The mixture was cooled to 100 deg C. and 200 ml water was added dropwise. The resulting mixture was then further cooled to RT with stirring and poured into 1600 ml water. The aqueous solution was neutralized to pH>8 with sodium carbonate with foaming. The resulting yellow precipitate was filtered off and air dried. Recrystallization from 1600 ml acetonitrile gave 42.5 g of brown/yellow plates. The filtrate from the acetonitrile recrystallization was concentrated to about 300 ml, cooled, and an additional 5.8 g solid was collected. The total yield (2 crops) was 48.3 g (after vacuum drying at RT) or 95% of theory.

18 g of the above material was dissolved in 300 ml THF and 5 g lithium t-butoxide was added in one portion at RT. A yellow precipitate was immediately formed. After stirring for 1 hour, a yellow solid filtered off and washed with ether. After drying, 16.75 g of MC-20 was obtained.

Example 9

Fabrication of Devices 8-1 through 8-6

A series of EL devices (8-1 through 8-6) were constructed in the following manner.

1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL1) by plasma-assisted deposition of $CHF_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A 35 nm light-emitting layer (LEL) of $Alq_3$ was then deposited.
5. A 35 nm electron-transporting layer (ETL) of $Alq_3$ or a mixture of Cpd-1 (rubrene) and MC-20, see Table 8, was vacuum-deposited over the LEL.
6. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment.

The devices thus formed were tested for drive voltage and luminous efficiency at an operating current of 20 $mA/cm^2$ and the results are reported in Table 8.

TABLE 8

Device data for 8-1 through 8-6, Example 9.

| Device | Example | % $Alq_3$ | % MC-20 | % Cpd-1 | Volt.[1] (V) | Luminance Efficiency (W/A) |
|---|---|---|---|---|---|---|
| 8-1 | Comparative | 100 | 0 | 0 | 7.2 | 0.020 |
| 8-2 | Inventive | 0 | 100 | 0 | 6.9 | 0.019 |
| 8-3 | Inventive | 0 | 10 | 90 | 5.9 | 0.019 |
| 8-4 | Inventive | 0 | 25 | 75 | 5.4 | 0.019 |
| 8-5 | Inventive | 0 | 50 | 50 | 5.6 | 0.019 |
| 8-6 | Inventive | 0 | 75 | 25 | 6.0 | 0.019 |

[1]The voltage needed to produce an operating current of 20 $mA/cm^2$

As illustrated in the inventive examples of Table 8, when the electron-transporting layer of a device consists of the metal complex MC-20 or mixed with carbocycle Cpd-1, one can obtain a reduction in the device voltage, while still maintaining good luminance efficiency compared to the comparison devices; example 8-1, $Alq_3$(100%).

Example 11

Fabrication of Comparative Devices 10-1 through 10-6

A series of EL devices (10-1 through 10-6) were constructed in the following manner.

1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL1) by plasma-assisted deposition of $CHF_3$ as described in U.S. Pat. No. 6,208,075
3. Next a layer of hole-transporting material 4,4'-Bis[N-(1-naphthyl)-N-phenylamino]biphenyl (NPB) was deposited to a thickness of 75 nm.
4. A 20 nm light-emitting layer (LEL) of Cpd-12 with 1.5 volume % of blue dopant L55 was then deposited.
5. A 35 nm electron-transporting layer (ETL) of $Alq_3$ or a mixture of MC-16 and Cpd-12, see Table 8, was vacuum-deposited over the LEL.
6. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment. The devices thus formed were tested for drive voltage and luminous efficiency at an operating current of 20 $mA/cm^2$ and the results are reported in Table 10.

TABLE 10

Device data for 10-1 through 10-6, Example 11.

| Device | Example | % $Alq_3$ | % MC-16 | % Cpd-12 | Volt.[1] (V) | Luminance Efficiency (W/A) | CIE x/y |
|---|---|---|---|---|---|---|---|
| 10-1 | Comparative | 100 | 0 | 0 | 6.5 | 0.051 | 0.159 0.170 |
| 10-2 | Comparative | 0 | 100 | 0 | 19.7 | 0.0016 | 0.141 0.127 |
| 10-3 | Comparative | 0 | 90 | 10 | 10.7 | 0.041 | 0.142 0.116 |
| 10-4 | Comparative | 0 | 75 | 25 | 6.1 | 0.132 | 0.142 0.128 |
| 10-5 | Comparative | 0 | 50 | 50 | 5.5 | 0.133 | 0.142 0.129 |
| 10-6 | Comparative | 0 | 25 | 75 | 5.7 | 0.122 | 0.142 0.128 |

[1]The voltage needed to produce an operating current of 20 $mA/cm^2$

Example 12

Fabrication of Comparative Devices 11-1 through 11-6

A series of EL devices (11-1 through 11-6) were constructed in an identical manner as described for Example 11, except that the metal complex MC-16 was replaced with MC-3.

The devices thus formed were tested for drive voltage and luminous efficiency at an operating current of 20 mA/cm$^2$ and the results are reported in Table 11.

TABLE 11

Device data for 11-1 through 11-6, Example 12.

| Device | Example | % Alq$_3$ | % MC-3 | % Cpd-12 | Volt.[1] (V) | Luminance Efficiency (W/A) | CIE x/y |
|---|---|---|---|---|---|---|---|
| 10-1 | Comparative | 100 | 0 | 0 | 8.0 | 0.053 | 0.165 0.181 |
| 10-3 | Comparative | 0 | 90 | 10 | 9.2 | 0.047 | 0.150 0.139 |
| 10-4 | Comparative | 0 | 75 | 25 | 7.1 | 0.091 | 0.149 0.135 |
| 10-5 | Comparative | 0 | 50 | 50 | 6.4 | 0.118 | 0.151 0.143 |
| 10-6 | Comparative | 0 | 25 | 75 | 8.2 | 0.086 | 0.148 0.143 |

[1] The voltage needed to produce an operating current of 20 mA/cm$^2$

Example 16

Fabrication of Devices 15-1 through 15-6

A series of EL devices (15-1 through 15-6) was constructed in an identical manner as described for Example 11, except that the metal complex MC-16 was replaced with MC-20.

The devices thus formed were tested for drive voltage and luminous efficiency at an operating current of 20 mA/cm$^2$ and the results are reported in Table 15.

TABLE 15

Device data for 15-1 through 15-6, Example 16.

| Device | Example | % Alq$_3$ | % MC-20 | % Cpd-12 | Volt.[1] (V) | Luminance Efficiency (W/A) | CIE x/y |
|---|---|---|---|---|---|---|---|
| 15-1 | Comparative | 100 | 0 | 0 | 6.5 | 0.051 | 0.160 0.171 |
| 15-2 | Inventive | 0 | 100 | 0 | 6.4 | 0.048 | 0.145 0.134 |
| 15-3 | Inventive | 0 | 90 | 10 | 6.7 | 0.047 | 0.145 0.134 |
| 15-4 | Inventive | 0 | 75 | 25 | 5.5 | 0.079 | 0.145 0.137 |
| 15-5 | Inventive | 0 | 50 | 50 | 5.1 | 0.103 | 0.145 0.139 |
| 15-6 | Inventive | 0 | 25 | 75 | 5.8 | 0.091 | 0.145 0.139 |

[1] The voltage needed to produce an operating current of 20 mA/cm$^2$

As illustrated in the inventive examples of Table 15, when the electron-transporting layer of a device consists of the metal complex MC-20 or mixed with carbocycle Cpd-12, one can obtain a device voltage similar or lower to comparison 15-1 or the comparison materials MC-16 (see Table 10) or MC-3 (see Table 11). However, the luminance efficiency and CIE color coordinates of the examples of the invention are excellent when compared to the comparison devices.

Example 17

Fabrication of Devices 16-1 through 16-6

A series of EL devices (16-1 through 16-6) was constructed in an identical manner as described for Example 9, except that the carbocycle Cpd-1, was replaced with Cpd-12.

The devices thus formed were tested for drive voltage and luminous efficiency at an operating current of 20 mA/cm$^2$ and the results are reported in Table 16.

TABLE 16

Device data for 16-1 through 16-6, Example 17.

| Device | Example | % Alq$_3$ | % MC-20 | % Cpd-12 | Volt.[1] (V) | Luminance Efficiency (W/A) | CIE x/y | |
|---|---|---|---|---|---|---|---|---|
| 16-1 | Comparative | 100 | 0 | 0 | 6.8 | 0.021 | 0.333 | 0.550 |
| 16-2 | Inventive | 0 | 100 | 0 | 6.3 | 0.020 | 0.329 | 0.544 |
| 16-3 | Inventive | 0 | 10 | 90 | 7.9 | 0.021 | 0.325 | 0.548 |
| 16-4 | Inventive | 0 | 25 | 75 | 8.4 | 0.020 | 0.346 | 0.555 |
| 16-5 | Inventive | 0 | 50 | 50 | 5.1 | 0.021 | 0.336 | 0.547 |
| 16-6 | Inventive | 0 | 75 | 25 | 5.6 | 0.021 | 0.330 | 0.546 |

[1]The voltage needed to produce an operating current of 20 mA/cm$^2$

As illustrated in the inventive examples of Table 16, when the electron-transporting layer of a device consists of the metal complex MC-20 or mixed with carbocycle Cpd-12, on average, one can obtain a device voltage similar to or lower than comparison 16-1 with similar luminance efficiency and CIE color coordinates of the examples of the invention.

Example 21

Fabrication of Comparative Devices 20-1 through 20-5

A series of EL devices (20-1 through 20-5) was constructed in an identical manner as described for Example 9, except that the metal complex MC-20 in the ETL was replaced with MC-28.

The devices thus formed were tested for drive voltage and luminous efficiency at an operating current of 20 mA/cm$^2$ and the results are reported in Table 20.

TABLE 20

Device data for 20-1 through 20-5, Example 21.

| Device | Example | % MC-28 | % Cpd-1 | Volt.[1] (V) | Luminance Efficiency (W/A) | CIE x/y | |
|---|---|---|---|---|---|---|---|
| 20-1 | Comparative | 100 | 0 | 9.8 | 0.014 | 0.330 | 0.541 |
| 20-2 | Comparative | 90 | 10 | 9.9 | 0.011 | 0.390 | 0.527 |
| 20-3 | Comparative | 75 | 25 | 6.2 | 0.020 | 0.341 | 0.542 |
| 20-4 | Comparative | 50 | 50 | 5.0 | 0.020 | 0.339 | 0.542 |
| 20-5 | Comparative | 25 | 75 | 5.0 | 0.019 | 0.334 | 0.541 |

[1]The voltage needed to produce an operating current of 20 mA/cm$^2$

As illustrated in the inventive examples of Table 20, when the electron-transporting layer of a device consists of the metal complex MC-28 or mixed with carbocycle Cpd-1, the results are inferior to those in Example 9 (Table 8) with MC-20.

Example 22

Fabrication of Comparative Devices 21-1 through 21-5

A series of EL devices (21-1 through 21-5) was constructed in an identical manner as described for Example 9, except that the metal complex MC-20 in the ETL was replaced with MC-30.

The devices thus formed were tested for drive voltage and luminous efficiency at an operating current of 20 mA/cm$^2$ and the results are reported in Table 21.

TABLE 21

Device data for 21-1 through 21-5, Example 22.

| Device | Example | % MC-30 | % Cpd-1 | Volt.[1] (V) | Luminance Efficiency (W/A) | CIE x/y |
|---|---|---|---|---|---|---|
| 21-1 | Comparative | 100 | 0 | 8.8 | 0.016 | 0.325 0.543 |
| 21-2 | Comparative | 90 | 10 | 8.8 | 0.013 | 0.355 0.535 |
| 21-3 | Comparative | 75 | 25 | 6.7 | 0.017 | 0.337 0.542 |
| 21-4 | Comparative | 50 | 50 | 5.7 | 0.018 | 0.332 0.544 |
| 21-5 | Comparative | 25 | 75 | 5.6 | 0.017 | 0.333 0.542 |

[1]The voltage needed to produce an operating current of 20 mA/cm$^2$

As illustrated in the inventive examples of Table 21, on average, when the electron-transporting layer of a device consists of the metal complex MC-30 or mixed with carbocycle Cpd-1, the results are inferior to those in Example 9 (Table 8) with MC-20.

Example 27

Fabrication of Devices 26-1 through 26-12

A series of EL devices (26-1 through 26-12) were constructed in the following manner.
1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL1) by plasma-assisted deposition of CHF$_3$ as described in U.S. Pat. No. 6,208,075.
3. A hole-injecting layer (HIL2) of dipyrazino[2,3-f:2',3'-h]quinoxalinehexacarbonitrile was deposited to a thickness of 10 nm.
4. Next a layer of hole-transporting material 4,4'-Bis[N-(1-naphthyl)-N-phenylamino]biphenyl (NPB) was deposited to a thickness of 100 nm.
5. A 40 nm light-emitting layer (LEL) of red dopant, L22 (2 volume %) in Cpd-12 was then deposited.
6. An electron-transporting layer (ETL) of Alq$_3$, Cpd-12, a mixture of Cpd-12 and MC-1, or MC-1, see Table 26, was vacuum-deposited over the LEL.
7. An electron-injection layer (EIL) of 3.5 nm of MC-20 or 0.5 nm lithium fluoride, see Table 26, was vacuum deposited onto the ETL, followed by a 100 nm layer of aluminum, to form a cathode layer.

The total thickness of the ETL and EIL layers was 35.5 nm. So when the EIL was MC-20 (3.5 nm) the ETL had a thickness of 32.0 nm, when the EIL was lithium fluoride, the ETL had a thickness of 35.0 nm.

The above sequence completes the deposition of the EL device. The device is then hermetically packaged in a dry glove box for protection against ambient environment.

The devices thus formed were tested for drive voltage and luminous efficiency at an operating current of 20 mA/cm$^2$ and the results are reported in Table 26.

TABLE 26

Device data for 26-1 through 26-12, Example 27.

| Device | Example | % Alq$_3$ | % Cpd-12 | % MC-1 | EIL | Volt.[1] (V) | Luminance Efficiency (W/A) | CIE x/y |
|---|---|---|---|---|---|---|---|---|
| 26-1 | Inventive | 100 | 0 | 0 | MC-20 | 8.2 | 0.080 | 0.277 0.620 |
| 26-2 | Comparative | 100 | 0 | 0 | LiF | 8.6 | 0.072 | 0.278 0.619 |
| 26-3 | Comparative | 100 | 0 | 0 | — | 10.5 | 0.022 | 0.285 0.615 |
| 26-4 | Inventive | 0 | 100 | 0 | MC-20 | 5.1 | 0.104 | 0.300 0.617 |
| 26-5 | Comparative | 0 | 100 | 0 | LiF | 12.0 | 0.001 | 0.316 0.609 |
| 26-6 | Comparative | 0 | 100 | 0 | — | 11.3 | 0.0003 | 0.314 0.611 |
| 26-7 | Inventive | 0 | 50 | 50 | MC-20 | 5.2 | 0.119 | 0.292 0.617 |
| 26-8 | Comparative | 0 | 50 | 50 | LiF | 6.9 | 0.103 | 0.293 0.616 |
| 26-9 | Comparative | 0 | 50 | 50 | — | 7.8 | 0.097 | 0.284 0.619 |
| 26-10 | Inventive | 0 | 0 | 100 | MC-20 | 11.2 | 0.081 | 0.267 0.614 |
| 26-11 | Comparative | 0 | 0 | 100 | LiF | 11.9 | 0.072 | 0.271 0.613 |
| 26-12 | Comparative | 0 | 0 | 100 | — | 12.2 | 0.075 | 0.270 0.613 |

[1]The voltage needed to produce an operating current of 20 mA/cm$^2$

As illustrated in the inventive examples of Table 26, when the electron-injecting layer of a device comprises of the metal complex MC-20, one obtains improved drive voltage with increased luminance efficiency compared to the comparison devices. Inventive example 26-7, with a mixture of Cpd-12 and MC-1 in the electron-transporting layer, shows even more improvement in the drive voltage and increased luminance efficiency, while not suffering any color change as shown in example 26-4.

Example 28

Fabrication of Devices 27-1 through 27-10

A series of EL devices (27-1 through 27-10) were constructed in the following manner.
1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.

2. Over the ITO was deposited a 1 nm fluorocarbon (CFx) hole-injecting layer (HIL1) by plasma-assisted deposition of CHF3 as described in U.S. Pat. No. 6,208,075.
3. A hole-injecting layer (HIL2) of dipyrazino[2,3-f:2',3'-h]quinoxalinehexacarbonitrile was deposited to a thickness of 10 nm.
4. Next a layer of hole-transporting material 4,4'-Bis[N-(1-naphthyl)-N-phenylamino]biphenyl (NPB) was deposited to a thickness of 85 nm.
5. A 20 nm light-emitting layer (LEL) of blue dopant, L55 (1.5 volume %) in Cpd-12 was then deposited.
6. An electron-transporting layer (ETL) of $Alq_3$, Cpd-12, a mixture of Cpd-12 and MC-1, MC-1, a mixture of Cpd-12 and MC-20, or MC-20, see Table 27, was vacuum-deposited over the LEL. Device 27-1 contained only $Alq_3$ in the ETL.
7. An electron-injection layer (EIL) of 3.5 nm of MC-20 or 0.5 nm lithium fluoride, see Table 27, was vacuum deposited onto the ETL, followed by a 100 nm layer of aluminum, to form a cathode layer.

The total thickness of the ETL and EIL layers was 35.5 nm. So when the EIL was MC-20 (3.5 nm) the ETL had a thickness of 32.0 nm, when the EIL was lithium fluoride, the ETL had a thickness of 35.0 nm.

The above sequence completes the deposition of the EL device. The device is then hermetically packaged in a dry glove box for protection against ambient environment.

The devices thus formed were tested for drive voltage and luminous efficiency at an operating current of 20 $mA/cm^2$ and the results are reported in Table 27.

Example 29

Fabrication of Devices 28-1 through 28-12

A series of EL devices (28-1 through 28-12) were constructed in the following manner.
1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL1) by plasma-assisted deposition of $CHF_3$ as described in U.S. Pat. No. 6,208,075.
3. A hole-injecting layer (HIL2) of dipyrazino[2,3-f:2',3'-h]quinoxalinehexacarbonitrile was deposited to a thickness of 10 nm.
4. Next a layer of hole-transporting material 4,4'-Bis[N-(1-naphthyl)-N-phenylamino]biphenyl (NPB) was deposited to a thickness of 85 nm.
5. A 20 nm light-emitting layer (LEL) of blue dopant, L55 (1.5 volume %) in Cpd-12 was then deposited.
6. An electron-transporting layer (ETL) of $Alq_3$, Cpd-12, a mixture of Cpd-12 and MC-1, or MC-1, see Table 28, was vacuum-deposited over the LEL.
7. An electron-injection layer (EIL) of 3.5 nm of MC-20 or 0.5 nm lithium fluoride, see Table 28, was vacuum deposited onto the ETL, followed by a 100 nm layer of aluminum, to form a cathode layer.

TABLE 27

Device data for 27-1 through 27-12, Example 28.

| | | ETL | | | | Luminance | | |
| --- | --- | --- | --- | --- | --- | --- | --- | --- |
| Device | Example | % Cpd-12 | % MC-1 | % MC-20 | EIL | Volt.[1] (V) | Efficiency (W/A) | CIE x/y |
| 27-1 | Inventive | 0 | 0 | 0 | MC-20 | 6.3 | 0.061 | 0.158 0.183 |
| 27-2 | Inventive | 100 | 0 | 0 | MC-20 | 4.7 | 0.116 | 0.144 0.162 |
| 27-3 | Inventive | 50 | 0 | 50 | MC-20 | 4.7 | 0.125 | 0.144 0.144 |
| 27-4 | Inventive | 50 | 0 | 50 | LiF | 5.3 | 0.104 | 0.143 0.144 |
| 27-5 | Inventive | 50 | 0 | 50 | — | 6.4 | 0.075 | 0.143 0.143 |
| 27-6 | Inventive | 0 | 0 | 100 | MC-20 | 6.3 | 0.058 | 0.143 0.133 |
| 27-7 | Inventive | 50 | 50 | 0 | MC-20 | 4.6 | 0.142 | 0.144 0.146 |
| 27-8 | Comparative | 50 | 50 | 0 | LiF | 6.0 | 0.111 | 0.142 0.139 |
| 27-9 | Comparative | 50 | 50 | 0 | — | 6.4 | 0.104 | 0.142 0.139 |
| 27-10 | Inventive | 0 | 100 | 0 | MC-20 | 8.8 | 0.065 | 0.144 0.138 |

[1]The voltage needed to produce an operating current of 20 $mA/cm^2$

As illustrated in the inventive examples of Table 27, when the electron-injecting layer or electron-transporting layer of a device comprises metal complex MC-20, one obtains improved drive voltage with increased luminance efficiency compared to the comparison devices. Inventive examples 27-3 and 27-7, with a mixture of Cpd-12 and MC-20 or MC-1 in the electron-transporting layer, shows even more improvement in the drive voltage and increased luminance efficiency.

The total thickness of the ETL and EIL layers was 35.5 nm. So when the EIL was MC-20 (3.5 nm) the ETL had a thickness of 32.0 nm, when the EIL was lithium fluoride, the ETL had a thickness of 35.0 nm.

The above sequence completes the deposition of the EL device. The device is then hermetically packaged in a dry glove box for protection against ambient environment. The devices thus formed were tested for drive voltage and luminous efficiency at an operating current of 20 $mA/cm^2$ and the results are reported in Table 28.

TABLE 28

Device data for 28-1 through 28-12, Example 29.

| | | ETL | | | | Luminance | | CIE | |
|---|---|---|---|---|---|---|---|---|---|
| Device | Example | % Alq$_3$ | % Cpd-12 | % MC-1 | EIL | Volt.[1] (V) | Efficiency (W/A) | x | y |
| 28-1 | Inventive | 100 | 0 | 0 | MC-20 | 6.4 | 0.068 | 0.155 | 0.177 |
| 28-2 | Comparative | 100 | 0 | 0 | LiF | 6.5 | 0.061 | 0.156 | 0.182 |
| 28-3 | Comparative | 100 | 0 | 0 | — | 8.5 | 0.018 | 0.161 | 0.195 |
| 28-4 | Inventive | 0 | 100 | 0 | MC-20 | 4.7 | 0.133 | 0.144 | 0.157 |
| 28-5 | Comparative | 0 | 100 | 0 | LiF | 9.2 | 0.0017 | 0.139 | 0.148 |
| 28-6 | Comparative | 0 | 100 | 0 | — | 9.0 | 0.0004 | 0.139 | 0.147 |
| 28-7 | Inventive | 0 | 50 | 50 | MC-20 | 4.7 | 0.148 | 0.142 | 0.143 |
| 28-8 | Comparative | 0 | 50 | 50 | LiF | 6.0 | 0.166 | 0.142 | 0.141 |
| 28-9 | Comparative | 0 | 50 | 50 | — | 6.6 | 0.103 | 0.142 | 0.140 |
| 28-10 | Inventive | 0 | 0 | 100 | MC-20 | 8.9 | 0.070 | 0.144 | 0.144 |
| 28-11 | Comparative | 0 | 0 | 100 | LiF | 9.6 | 0.065 | 0.144 | 0.145 |
| 28-12 | Comparative | 0 | 0 | 100 | — | 9.7 | 0.064 | 0.143 | 0.144 |

[1]The voltage needed to produce an operating current of 20 mA/cm$^2$

As illustrated in the inventive examples of Table 28, when the electron-injecting layer or electron-transporting layer of a device comprises metal complex MC-20, one obtains improved drive voltage with increased luminance efficiency compared to the comparison devices. Inventive example 28-7, with a mixture of Cpd-12 and MC-1 in the electron-transporting layer, shows even more improvement in the drive voltage and increased luminance efficiency, without the color shift shown in example 28-4.

Example 31

Fabrication of Devices 30-1 through 30-12

A series of EL devices (30-1 through 30-12) were constructed in the following manner.
1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL1) by plasma-assisted deposition of CHF$_3$ as described in U.S. Pat. No. 6,208,075.
3. A hole-injecting layer (HIL2) of dipyrazino[2,3-f:2',3'-h]quinoxalinehexacarbonitrile was deposited to a thickness of 10 nm.
4. Next a layer of hole-transporting material 4,4'-Bis[N-(1-naphthyl)-N-phenylamino]biphenyl (NPB) was deposited to a thickness of 134 nm.
5. A 20 nm light-emitting layer (LEL) of dopant, L46 (1.5 volume %) in L5 was then deposited.
6. An electron-transporting layer (ETL) of Alq$_3$, Cpd-12, a mixture of Cpd-12 and MC-1, or a mixture of Cpd-12 and MC-20, see Table 30, was vacuum-deposited over the LEL.
7. An electron-injection layer (EIL) of 3.5 nm of MC-20 or 0.5 nm lithium fluoride, see Table 30, was vacuum deposited onto the ETL, followed by a 100 nm layer of aluminum, to form a cathode layer.

The total thickness of the ETL and EIL layers was 40 nm. So when the EIL was MC-20 (3.5 nm) the ETL had a thickness of 36.5 nm, when the EIL was lithium fluoride, the ETL had a thickness of 39.5 nm.

The above sequence completes the deposition of the EL device. The device is then hermetically packaged in a dry glove box for protection against ambient environment. The devices thus formed were tested for drive voltage and luminous efficiency at an operating current of 20 mA/cm$^2$ and the results are reported in Table 30.

TABLE 30

Device data for 30-1 through 30-12, Example 31.

| | | ETL | | | | | Luminance | | CIE | |
|---|---|---|---|---|---|---|---|---|---|---|
| Device | Example | % Alq$_3$ | % Cpd-12 | % MC-1 | % MC-20 | EIL | Volt.[1] (V) | Efficiency (W/A) | x | y |
| 30-1 | Inventive | 100 | 0 | 0 | 0 | MC-20 | 5.5 | 0.063 | 0.646 | 0.349 |
| 30-2 | Comparative | 100 | 0 | 0 | 0 | LiF | 5.8 | 0.059 | 0.645 | 0.350 |
| 30-3 | Comparative | 100 | 0 | 0 | 0 | — | 7.4 | 0.020 | 0.628 | 0.362 |
| 30-4 | Inventive | 0 | 100 | 0 | 0 | MC-20 | 5.6 | 0.082 | 0.658 | 0.341 |
| 30-5 | Comparative | 0 | 100 | 0 | 0 | LiF | 6.1 | 0.0008 | 0.652 | 0.342 |
| 30-6 | Comparative | 0 | 100 | 0 | 0 | — | 5.8 | 0.0001 | 0.648 | 0.342 |
| 30-7 | Inventive | 0 | 50 | 50 | 0 | MC-20 | 5.0 | 0.153 | 0.659 | 0.340 |
| 30-8 | Comparative | 0 | 50 | 50 | 0 | LiF | 5.8 | 0.149 | 0.659 | 0.340 |
| 30-9 | Comparative | 0 | 50 | 50 | 0 | — | 6.1 | 0.142 | 0.659 | 0.340 |
| 30-10 | Inventive | 0 | 50 | 0 | 50 | MC-20 | 4.8 | 0.114 | 0.659 | 0.343 |
| 30-11 | Inventive | 0 | 50 | 0 | 50 | LiF | 5.3 | 0.083 | 0.651 | 0.346 |
| 30-12 | Inventive | 0 | 50 | 0 | 50 | — | 5.7 | 0.049 | 0.650 | 0.347 |

[1]The voltage needed to produce an operating current of 20 mA/cm$^2$

As illustrated in the inventive examples of Table 30, when the electron-injecting layer of a device comprises metal complex MC-20, one obtains improved drive voltage with increased luminance efficiency compared to the comparison devices. Inventive example 30-7 and 30-10, with a mixture of Cpd-12 and MC-1 or MC-20 in the electron-transporting layer, show even more improvement in the drive voltage and increased luminance efficiency.

Example 32

Fabrication of Devices 31-1 through 31-4

A series of EL devices (31-1 through 31-4) were constructed in the following manner.
1. A glass substrate coated with an 20 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL1) by plasma-assisted deposition of $CHF_3$ as described in U.S. Pat. No. 6,208,075.
3. A hole-injecting layer (HIL2) of dipyrazino[2,3-f:2',3'-h]quinoxalinehexacarbonitrile was deposited to a thickness of 10 nm.
4. Next a layer of hole-transporting material 4,4'-Bis[N-(1-naphthyl)-N-phenylamino]biphenyl (NPB) was deposited to a thickness of 134 nm.
5. A light-emitting layer (LEL) was then deposited, see Table 31 for which LEL was used. The red LEL was 40 nm thick of red dopant, L46 (0.5 volume %) in L5. The blue LEL was 20 nm thick blue dopant, L55 (1.5 volume %) in Cpd-12.
6. An electron-transporting layer (ETL) of Cpd-12 and MC-1 as a 50/50 mixture by volume, was vacuum-deposited over the LEL.
7. An electron-injection layer (EIL) of MC-20 was vacuum deposited onto the ETL, followed by a 100 nm layer of aluminum, to form a cathode layer.

The total thickness of the ETL and EIL layers was 35 nm. So when the EIL was MC-20 (3.5 nm), the ETL had a thickness of 31.5 nm.

The above sequence completes the deposition of the EL device. The device is then hermetically packaged in a dry glove box for protection against ambient environment. The devices thus formed were tested for drive voltage and luminous efficiency at an operating current of 20 mA/cm$^2$ and the results are reported in Table 31.

As illustrated in the inventive examples of Table 31, when the electron-injecting layer of a device comprises metal complex MC-20 and an anthracene, one obtains improved drive voltage with increased luminance efficiency compared to the comparison devices.

Example 33

Fabrication of Devices 32-1 through 32-4

A series of EL devices (32-1 through 32-4) were constructed in the following manner.
1. A glass substrate coated with an 20 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL1) by plasma-assisted deposition of $CHF_3$ as described in U.S. Pat. No. 6,208,075.
3. A hole-injecting layer (HIL2) of dipyrazino[2,3-f:2',3'-h]quinoxalinehexacarbonitrile was deposited to a thickness of 10 nm.
4. A light-emitting layer (LEL) of Cpd-9 (30 volume %), and Cpd-3 (2 volume %) in 4,4'-Bis[N-(1-naphthyl)-N-phenylamino]biphenyl (NPB) was deposited to a thickness of 20 nm.
5. A second light-emitting layer (LEL) of L55 (1.5 volume %) in Cpd-12 was deposited to a thickness of 20 nm.
6. An electron-transporting layer (ETL) of Cpd-12, Bphen, or $Alq_3$, and MC-20, see Table 32, as a 50/50 mixture by volume, was vacuum-deposited over the LEL to a thickness of 31.5 nm.
7. An electron-injection layer (EIL) of MC-20 was vacuum deposited onto the ETL to a thickness of 35 nm.

The above sequence completes the deposition of the EL device. The device is then hermetically packaged in a dry glove box for protection against ambient environment. The devices thus formed were tested for drive voltage and luminous efficiency at an operating current of 20 mA/cm$^2$ and the results are reported in Table 32.

TABLE 31

Device data for 31-1 through 31-4, Example 32.

| Device | Example | color | MC-20 thickness | Volt.[1] (V) | Luminance Efficiency (W/A) | CIE x/y | |
|---|---|---|---|---|---|---|---|
| 31-1 | Comparative | red | 0 | 4.5 | 0.12 | 0.66 | 0.34 |
| 31-2 | Inventive | red | 3.5 | 3.6 | 0.135 | 0.66 | 0.34 |
| 31-3 | Comparative | blue | 0 | 6.5 | 0.11 | 0.14 | 0.13 |
| 31-4 | Inventive | blue | 3.5 | 3.4 | 0.17 | 0.14 | 0.13 |

[1]The voltage needed to produce an operating current of 20 mA/cm$^2$

TABLE 32

Device data for 32-1 through 32-4, Example 33.

| Device | Example | ETL | Volt.[1] (V) | Luminance Efficiency (W/A) | CIE x | CIE y |
|---|---|---|---|---|---|---|
| 32-1 | Inventive | Cpd-12/MC-20 | 3.5 | 0.11 | 0.41 | 0.39 |
| 32-2 | Inventive | Bphen/MC-20 | 4.7 | 0.06 | 0.4 | 0.38 |
| 32-3 | Inventive | Alq$_3$/MC-20 | 5.2 | 0.06 | 0.39 | 0.39 |

[1]The voltage needed to produce an operating current of 20 mA/cm$^2$

As illustrated in the inventive examples of Table 32, when the electron-injecting layer of a device comprises metal complex MC-20, one obtains improved drive voltage with increased luminance efficiency compared to the comparison devices. Examples 32-1 and 32-2, with the electron-transporting layer additionally comprising a fused ring aromatic compound show even more improvement in the drive voltage and increased luminance efficiency.

Example 40

Comparative

The preparation of a conventional OLED is as follows: A ~1.1 mm thick glass substrate coated with a transparent ITO conductive layer was cleaned and dried using a commercial glass scrubber tool. The thickness of ITO is about 25 nm and the sheet resistance of the ITO is about 70 Ω/square. The ITO surface was subsequently treated with oxidative plasma to condition the surface as an anode. A layer of CFx, 1 nm thick, was deposited on the clean ITO surface as the anode buffer layer by decomposing CHF$_3$ gas in an RF plasma treatment chamber. The substrate was then transferred into a vacuum deposition chamber for deposition of all other layers on top of the substrate. The following layers were deposited in the following sequence by evaporation from a heated boat under a vacuum of approximately 10$^{-6}$ Torr:

a) an HIL, 10 nm thick, including Dpq-1
b) an HTL, 100 nm thick, including NPB;
c) an LEL, 40 nm thick, including Cpd-12 doped with 1.0 vol % L22;
d) an ETL, 25 nm thick, including Cpd-12;
e) an EIL, 2.5 nm thick, including MC-1; and
f) Cathode: approximately 120 nm thick, including Al.

Figure 2:
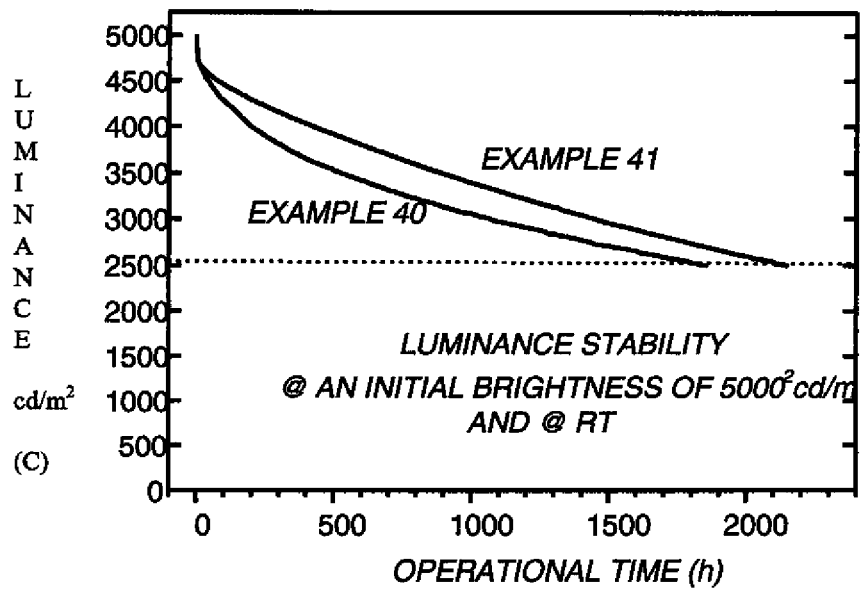
FIGS. 2 and 3 are graphs that show operating (luminance and voltage) lifetime data for comparative and inventive devices.
Figure 3:
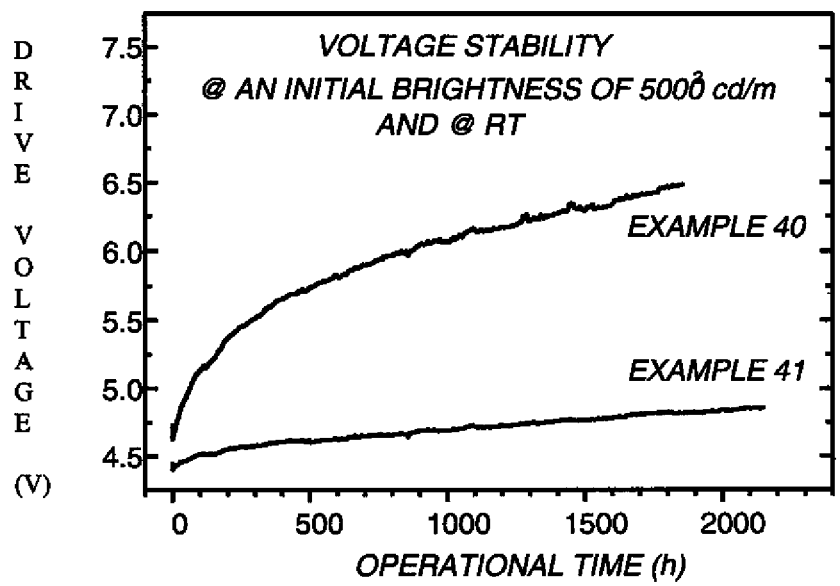

This OLED requires a drive voltage of about 3.6 V to pass 20 mA/cm$^2$. Under this test condition, the device has a luminance of 4,451 cd/m$^2$, and a luminous efficiency of about 22.8 cd/A. The color coordinates are CIE$_x$=0.233 and CIE$_y$=0.626, and the emission peak is at 504 nm. The T$_{50}$(@5,000 nit) is 1,854 hours. Therefore, the T$_{50}$(@1,000 nit) is estimated to be 24,300 hours. The EL performance data are summarized in Table 33. The lifetime testing curves of initial luminance vs. operational time and initial drive voltage vs. operational time are shown in FIGS. 2 and 3, respectively.

Example 41

Inventive

Another OLED, in accordance with the present invention, was constructed as the same as that in Example 40, except that layer e) was changed as:

e) an EIL, 2.5 nm thick, including MC-20.

This OLED requires a drive voltage of about 3.5 V to pass 20 mA/cm$^2$. Under this test condition, the device has a luminance of 4,603 cd/m$^2$, and a luminous efficiency of about 23.0 cd/A. The color coordinates are CIE$_x$=0.234 and CIE$_y$=0.627, and the emission peak is at 504 nm. Its T$_{50}$(@5,000 nit) is 2,174 hours. Therefore, the T$_{50}$(@1,000 nit) is estimated to be 28,200 hours. The EL performance data are summarized in Table 33. The lifetime testing curves of initial luminance vs. operational time and initial drive voltage vs. operational time are shown in FIGS. 2 and 3, respectively.

It is shown that using MC-20 as the EIL can further improve operational lifetime and reduce voltage rise over lifetime.

TABLE 33

Device data for Examples 40 and 41.

| Example (Type) (EL measured @ RT and 20 mA/cm$^2$) | Voltage (V) | Luminance (cd/m$^2$) | Luminous Efficiency (cd/A) | CIE x (1931) | CIE y (1931) | Emission Peak (nm) | T$_{50}$(@ 1,000 nit) (Hrs) |
|---|---|---|---|---|---|---|---|
| 40 (Comparative) | 3.6 | 4,451 | 22.8 | 0.233 | 0.626 | 504 | ~24,300 |
| 41 (Inventive) | 3.5 | 4,603 | 23.0 | 0.234 | 0.627 | 504 | ~28,200 |

Example 42

Devices 42-1 to 42-9

A series of EL devices (42-1 through 42-9) were constructed in the following manner.

1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of CHF$_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A 35 nm light-emitting layer (LEL) corresponding to the host material rubrene (Cpd-1) and 0.5% by volume of L46 (see p. 89) was then deposited.
5. A 35 nm electron-transporting layer (ETL) of Alq, cyclometalled complex or carbocyclic compound or a mixture of the two (as indicated in the table) was vacuum-deposited over the LEL.
6. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment. This is the same general device format as described in Example 2 of the specification. The color of light the devices produced was approximately the same throughout and corresponded to average 1931 CIE (Commission Internationale de L'Eclairage) $CIE_x$, $CIE_y$ coordinates of 0.65, 0.35.

TABLE 42

Device Data for 42-1 to 42-9: Example 42

| Device | Example | % Alq | % Complex | % Carbocycle | Voltage (V) |
|---|---|---|---|---|---|
| 42-1 | Comparison | 100 | — | — | 5.68 |
| 42-2 | Comparison | — | 100% MC-3 | — | 8.26 |
| 42-3 | Comparison | — | 100% MC-28 | — | 6.06 |
| 42-4 | Invention | — | 100% MC-20 | — | 4.11 |
| 42-5 | Comparison | — | 50% MC-3 | 50% Cpd-3 | 4.60 |
| 42-6 | Comparison | — | 50% MC-28 | 50% Cpd-3 | 4.23 |
| 42-7 | Invention | — | 50% MC-20 | 50% Cpd-3 | 3.62 |
| 42-8 | Comparison | — | 50% MC-28 | 50% Cpd-28 | 6.12 |
| 42-9 | Invention | — | 50% MC-20 | 50% Cpd-28 | 4.63 |

Direct comparison of devices 42-2 to 42-4 shows a significant decrease in driving voltage for the inventive compound MC-20. Comparison of devices 1-5 to 1-7 where the lithium complexes are mixed with a tetracene compound show a similar decrease in driving voltage with MC-20. Comparison of devices 1-8 and 1-9 show a even larger decrease in voltage when MC-20 is mixed with an anthracene derivative.

Example 43

Devices 43-1 to 43-10

A series of EL devices (43-1 through 43-10) were constructed in the following manner.
1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$ as described in U.S. Pat. No. 6,208,075.
7. Next a layer of hole-transporting material 4,4'-Bis[N-(1-naphthyl)-N-phenylamino]biphenyl (NPB) was deposited to a thickness of 75 nm.
8. A 35 nm light-emitting layer (LEL) corresponding to the host material rubrene (Cpd-1) and 0.5% by volume of L46 (see p. 89) was then deposited.
9. A 35 nm electron-transporting layer (ETL) of Alq, cyclometalled complex or carbocyclic compound or a mixture of the two (as indicated in the tables) was vacuum-deposited over the LEL.
10. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment. This is the same general device format as described in Example 2 (p. 77) of the specification. The devices thus formed were tested for luminous efficiency at an operating current of 20 mA/cm². The color of light the devices produced was approximately the same and corresponded to average 1931 CIE (Commission Internationale de L'Eclairage) $CIE_x$, $CIE_y$ coordinates of 0.65, 0.35.

TABLE 43

Device Data for 43-1 to 43-10: Example 43

| Device | Example | % Alq | % Li Salt | % Carbocycle | Voltage (V) | Efficiency (Cd/A) | Luminance Efficiency (W/A) |
|---|---|---|---|---|---|---|---|
| 43-1 | Comparison | 100 | — | — | 5.68 | | 0.045 |
| 43-2 | Comparison | — | 100% MC-3 | — | 8.26 | | 0.039 |
| 43-3 | Comparison | — | 25% MC-3 | 75% Cpd-3 | 4.83 | | 0.063 |
| 43-4 | Comparison | — | 50% MC-3 | 50% Cpd-3 | 4.60 | | 0.081 |
| 43-5 | Comparison | — | 75% MC-3 | 25% Cpd-3 | 5.09 | | 0.074 |
| 43-6 | Comparison | — | — | 100% Cpd-3 | 5.53 | 0.03 | 0.002 |
| 43-7 | Invention | — | 25% MC-20 | 75% Cpd-3 | 3.75 | 2.37 | 0.034 |
| 43-8 | Invention | — | 50% MC-20 | 50% Cpd-3 | 3.62 | 3.96 | 0.059 |
| 43-9 | Invention | — | 75% MC-20 | 25% Cpd-3 | 3.80 | 2.96 | 0.044 |
| 43-10 | Comparison | — | 100% MC-20 | — | 4.11 | 1.27 | 0.020 |

In Table 43, MC-3 is an organic complex not of the invention. Comparison of devices 1-3, 1-4 and 1-5 to corresponding devices 1-7, 1-8 and 1-9, respectively, which are the same except that MC-3 has been replaced with MC-20, an organic complex of the invention, show a large and significant decrease in voltage.

Example 44

Devices 44-1 to 44-29

A series of EL devices (44-1 through 44-29) were constructed in the same manner as Example 43 except for the changes noted in Table 44. Some comparisons have been added from Example 43.

TABLE 44

Device Data for 44-1 to 44-29: Example 44

| Device | Example | % Alq | % Li Salt | % Carbocycle | Voltage (V) | Efficiency (Cd/A) | Luminance Efficiency (W/A) |
|---|---|---|---|---|---|---|---|
| 43-1 | Comparison | 100 | — | — | 5.68 | | 0.045 |
| 44-1 | Comparison | — | — | 100% Cpd-28 | 6.23 | 0.044 | 0.0007 |
| 44-2 | Invention | — | 5% MC-20 | 95% Cpd-28 | 7.81 | 5.11 | 0.082 |
| 44-3 | Invention | — | 10% MC-20 | 90% Cpd-28 | 7.60 | 5.61 | 0.090 |
| 44-4 | Invention | — | 20% MC-20 | 80% Cpd-28 | 6.38 | 5.43 | 0.086 |
| 44-5 | Invention | — | 25% MC-20 | 75% Cpd-28 | 6.07 | 4.99 | 0.079 |
| 44-6 | Invention | — | 50% MC-20 | 50% Cpd-28 | 4.63 | 3.72 | 0.059 |
| 44-7 | Invention | — | 60% MC-20 | 40% Cpd-28 | 4.44 | 3.62 | 0.057 |
| 44-8 | Invention | — | 75% MC-20 | 25% Cpd-28 | 4.14 | 2.78 | 0.044 |
| 44-9 | Invention | — | 90% MC-20 | 10% Cpd-28 | 4.14 | 1.22 | 0.019 |
| 44-10 | Invention | — | 95% MC-20 | 5% Cpd-28 | 4.16 | 0.75 | 0.012 |
| 43-10 | Invention | — | 100% MC-20 | — | 4.11 | 1.27 | 0.020 |
| 43-6 | Comparison | — | — | 100% Cpd-3 | 5.53 | 0.03 | 0.002 |
| 44-11 | Invention | — | 5% MC-20 | 95% Cpd-3 | 3.96 | 0.27 | 0.003 |
| 44-12 | Invention | — | 10% MC-20 | 90% Cpd-3 | 3.80 | 0.75 | 0.009 |
| 44-13 | Invention | — | 20% MC-20 | 80% Cpd-3 | 3.85 | 2.01 | 0.028 |
| 44-14 (43-7) | Invention | — | 25% MC-20 | 75% Cpd-3 | 3.75 | 2.37 | 0.034 |
| 44-15 (43-8) | Invention | — | 50% MC-20 | 50% Cpd-3 | 3.62 | 3.96 | 0.059 |
| 44-16 | Invention | — | 60% MC-20 | 40% Cpd-3 | 3.88 | 3.94 | 0.058 |
| 44-17 (43-9) | Invention | — | 75% MC-20 | 25% Cpd-3 | 3.80 | 2.96 | 0.044 |
| 44-18 | Invention | — | 90% MC-20 | 10% Cpd-3 | 4.21 | 0.68 | 0.010 |
| 44-19 | Invention | — | 95% MC-20 | 5% Cpd-3 | 4.13 | 0.14 | 0.000 |
| 43-10 | Invention | — | 100% MC-20 | — | 4.11 | 1.27 | 0.020 |
| 44-20 | Comparison | — | — | 100% Cpd-1 | 3.74 | 0.02 | 0.00 |
| 44-21 | Invention | — | 5% MC-20 | 95% Cpd-1 | 4.14 | 0.26 | 0.00 |
| 44-22 | Invention | — | 10% MC-20 | 90% Cpd-1 | 3.87 | 1.39 | 0.02 |
| 44-23 | Invention | — | 20% MC-20 | 80% Cpd-1 | 3.64 | 4.41 | 0.07 |
| 44-24 | Invention | — | 25% MC-20 | 75% Cpd-1 | 3.64 | 4.57 | 0.07 |

TABLE 44-continued

Device Data for 44-1 to 44-29: Example 44

| Device | Example | % Alq | % Li Salt | % Carbocycle | Voltage (V) | Efficiency (Cd/A) | Luminance Efficiency (W/A) |
|---|---|---|---|---|---|---|---|
| 44-25 | Invention | — | 50% MC-20 | 50% Cpd-1 | 3.58 | 5.50 | 0.08 |
| 44-26 | Invention | — | 60% MC-20 | 40% Cpd-1 | 3.67 | 5.59 | 0.08 |
| 44-27 | Invention | — | 75% MC-20 | 25% Cpd-1 | 3.70 | 5.13 | 0.08 |
| 44-28 | Invention | — | 90% MC-20 | 10% Cpd-1 | 3.95 | 1.57 | 0.02 |
| 44-29 | Invention | — | 95% MC-20 | 5% Cpd-1 | 4.06 | 0.44 | 0.01 |

The results in Table 44 indicate that when the inventive metal complex is used in a mixed layer adjacent to the light emitting layer with a carbocyclic fused ring aromatic compound, there are increases in efficiency. The best results are obtained when the inventive metal complex is 10% or greater by volume or greater and less than 90% by volume.

Example 45

Devices 45-1 to 45-8 (Comparison)

A series of comparative EL devices (45-1 through 45-8) with MC-28 were constructed in the same manner as Examples 43 and 44 except for the changes noted in Table 44. Some comparisons have been added from Example 43.

The results in Table 45 directly compare the performance of the inventive metal complex to a non-inventive metal complex in a mixed ETL format. In every case, the inventive complex shows large and significant improvements in either voltage, efficiency or both.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

TABLE 45

Device Data for 45-1 to 45-8: Example 45

| Device | Example | % Li Salt | % Carbocycle | Voltage (V) | Efficiency (Cd/A) | Luminance Efficiency (W/A) |
|---|---|---|---|---|---|---|
| 44-1 | Comparison | — | 100% Cpd-28 | 6.23 | 0.044 | 0.0007 |
| 45-1 | Comparison | 10% MC-28 | 90% Cpd-28 | 8.57 | 2.11 | 0.035 |
| 44-3 | Invention | 10% MC-20 | 90% Cpd-28 | 7.60 | 5.61 | 0.090 |
| 45-2 | Comparison | 50% MC-28 | 50% Cpd-28 | 6.12 | 4.64 | 0.079 |
| 44-6 | Invention | 50% MC-20 | 50% Cpd-28 | 4.63 | 3.72 | 0.059 |
| 45-3 | Comparison | 90% MC-28 | 10% Cpd-28 | 5.78 | 2.73 | 0.046 |
| 44-9 | Invention | 90% MC-20 | 10% Cpd-28 | 4.14 | 1.22 | 0.019 |
| 45-4 | Comparison | 100% MC-28 | — | 5.89 | 2.14 | 0.036 |
| 43-10 | Invention | 100% MC-20 | — | 4.11 | 1.27 | 0.020 |
| 45-6 | Comparison | 10% MC-28 | 90% Cpd-3 | 3.77 | 0.05 | 0.0006 |
| 44-12 | Invention | 10% MC-20 | 90% Cpd-3 | 3.80 | 0.75 | 0.009 |
| 45-7 | Comparison | 50% MC-28 | 50% Cpd-3 | 4.23 | 3.33 | 0.048 |
| 44-15 (43-8) | Invention | 50% MC-20 | 50% Cpd-3 | 3.62 | 3.96 | 0.059 |
| 45-8 | Comparison | 90% MC-28 | 10% Cpd-3 | 5.93 | 1.41 | 0.017 |
| 44-18 | Invention | 10% MC-20 | 90% Cpd-3 | 3.80 | 0.75 | 0.009 |

PARTS LIST

101 Substrate
103 Anode
105 Hole-Injecting layer (HIL)
107 Hole-Transporting Layer (HTL)
109 Light-Emitting layer (LEL)
111 Electron-Transporting layer (ETL)
112 Electron-Injecting layer (EIL)
113 Cathode
150 Power Source
160 Conductor

The invention claimed is:

1. An OLED device comprising a cathode, a light emitting layer and an anode, in that order, and, having located between the cathode and the light emitting layer, a further layer containing an alkali metal or alkaline earth metal salt of a 2-(2-hydroxyphenyl)phenanthroline derivative,
    wherein the alkali metal or alkaline earth metal salt of a 2-(2-hydroxyphenyl)phenanthroline derivative is according to Formula (MC):

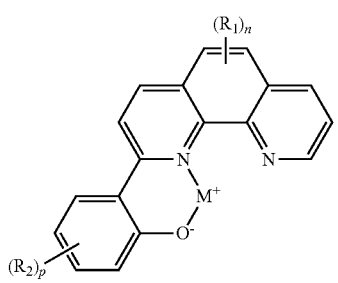

Formula (MC)

wherein:
    M is an alkali metal or alkaline earth metal;
    $R_1$ and $R_2$ are independently an alkyl group or an aryl group; and
    n is an integer from 0-7 and p is an integer from 0-4.

2. The device of claim 1 wherein M is lithium.

3. The device of claim 1 wherein the metal salt of a 2-(2-hydroxyphenyl)phenanthroline derivative is:

MC-20

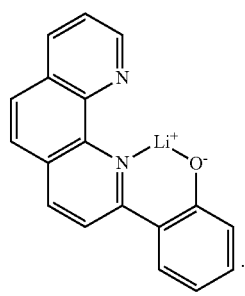

4. The device of claim 1 wherein the further layer additionally contains more than 10% by volume of a fused ring aromatic compound chosen from anthracenes and tetracenes.

5. The device of claim 4 wherein the fused ring aromatic compound is a tetracene represented by Formula (2):

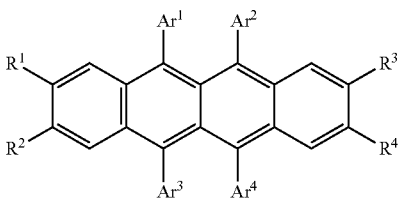

(2)

wherein:
    $Ar^1$-$Ar^4$ represent independently selected aromatic groups;
    $R^1$-$R^4$ represent hydrogen or independently selected substituents.

6. The device of claim 5 wherein in Formula (2), $Ar^1$ and $Ar^4$ are the same group; independently of $Ar^1$ and $Ar^4$, $Ar^2$ and $Ar^3$ are the same group; and $R^1$ and $R^4$ are not hydrogen and represent the same group.

7. The device of claim 4 wherein the fused ring aromatic compound is an anthracene represented by Formula (3):

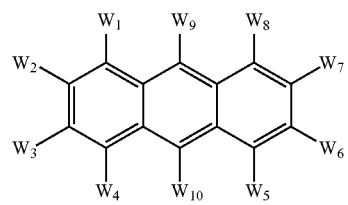

(3)

wherein:
    $W_9$ and $W_{10}$ are independently selected from phenyl, biphenyl, naphthyl and anthracenyl groups, and $W_1$-$W_8$ are independently selected from hydrogen, alkyl and phenyl groups.

8. The device of claim 1 wherein the further layer is directly adjacent to the light-emitting layer and further contains an additional layer, located between the further layer and the cathode, containing a cyclometallated organic alkali or alkaline earth metal complex represented by Formula (4')

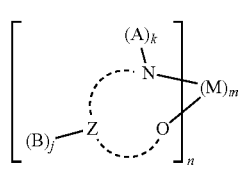

(4')

wherein:
    Z and the dashed arc represent two or three atoms and the bonds necessary to complete a 5- or 6-membered ring with M;
    each A represents H or a substituent and each B represents an independently selected substituent on the Z atoms, provided that two or more substituents may combine to form a fused ring or a fused ring system;
    j is an integer from 0-3 and k is 1 or 2;
    M represents an alkali or alkaline earth metal; and
    m and n are independently selected integers selected to provide a neutral charge on the complex.

9. The device of claim 8 wherein the cyclometallated organic complex of an alkali or alkaline earth metal in the additional layer is represented by Formula (5):

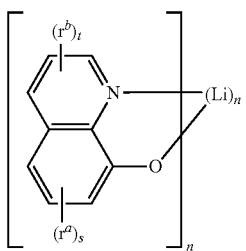

(5)

wherein:
each r$^a$ and r$^b$ represents an independently selected substituent, provided two substituents may combine to form a ring;
s is an integer from 0-3;
t is an integer from 0-3; and
n is an integer.

10. The device of claim 8 wherein the cyclometallated organic complex of an alkali or alkaline earth metal in the additional layer is according to Formula (MC):

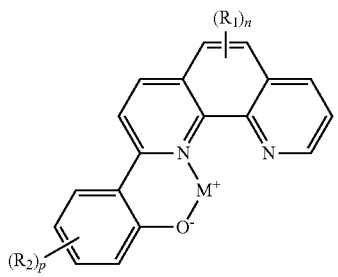

Formula (MC)

wherein:
M is an alkali metal or alkaline earth metal;
R$_1$ and R$_2$ are independently an alkyl or an aryl group; and
n is an integer from 0-7 and p is an integer from 0-4.

11. An OLED device comprising a cathode, a light emitting layer and an anode, in that order, and, having located between the cathode and the light emitting layer, a further layer containing an alkali metal or alkaline earth metal salt of a 2-(2-hydroxyphenyl)phenanthroline derivative,
wherein the alkali metal or alkaline earth metal salt of a 2-(2-hydroxyphenyl)phenanthroline derivative is according to Formula (MC):

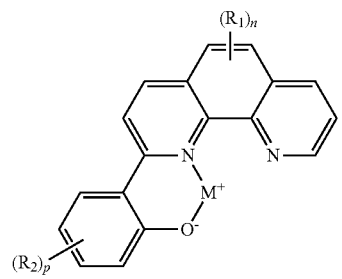

Formula (MC)

wherein:
M is an alkali metal or alkaline earth metal;
R$_1$ and R$_2$ are independently an alkyl group or an aryl group; and
n is an integer from 0-7 and p is an integer from 0-4;
wherein the further layer is directly adjacent to the cathode and further contains an additional layer, located between the further layer and the light-emitting layer, wherein the additional layer contains an anthracene.

* * * * *